(12) United States Patent
Ding et al.

(10) Patent No.: US 12,288,503 B2
(45) Date of Patent: Apr. 29, 2025

(54) GATE DRIVING UNIT AND DRIVING METHOD FOR THE SAME, SHIFT REGISTER CIRCUIT, AND DISPLAY APPARATUS

(71) Applicant: Xiamen Tianma Optoelectronics Co., Ltd., Fujian (CN)

(72) Inventors: Zongcai Ding, Xiamen (CN); Tianci Li, Xiamen (CN); Weiqiang Wu, Xiamen (CN); Jie Lin, Xiamen (CN); Xiaohe Li, Xiamen (CN); Qiongqin Mao, Xiamen (CN)

(73) Assignee: Xiamen Tianma Optoelectronics Co., Ltd., Xiamen (CN)

( * ) Notice: Subject to any disclaimer, the term of this patent is extended or adjusted under 35 U.S.C. 154(b) by 0 days.

(21) Appl. No.: 18/669,290

(22) Filed: May 20, 2024

(65) Prior Publication Data

US 2024/0312392 A1    Sep. 19, 2024

(30) Foreign Application Priority Data

Dec. 29, 2023   (CN) .......................... 202311872343.2

(51) Int. Cl.
  *G09G 3/20*  (2006.01)
  *G11C 19/18*  (2006.01)
  *G11C 19/28*  (2006.01)

(52) U.S. Cl.
  CPC ......... *G09G 3/2092* (2013.01); *G11C 19/184* (2013.01); *G09G 2310/0286* (2013.01); *G09G 2310/08* (2013.01); *G11C 19/28* (2013.01)

(58) Field of Classification Search
  None
  See application file for complete search history.

(56) References Cited

U.S. PATENT DOCUMENTS

| 2018/0204494 | A1* | 7/2018 | Shang ..................... G11C 19/28 |
| 2020/0185048 | A1* | 6/2020 | Yang ........................ G09G 3/36 |
| 2020/0286570 | A1* | 9/2020 | Shan ..................... G09G 3/2092 |
| 2024/0105091 | A1* | 3/2024 | Liu ........................ G09G 3/3677 |
| 2024/0296768 | A1* | 9/2024 | Jin ......................... G09G 3/3677 |

FOREIGN PATENT DOCUMENTS

| CN | 105528985 A | 4/2016 |
| CN | 103187040 B | 5/2017 |
| CN | 109671385 A | 4/2019 |
| CN | 111812902 B | 4/2023 |

* cited by examiner

*Primary Examiner* — Christopher J Kohlman
(74) *Attorney, Agent, or Firm* — CHRISTENSEN O'CONNOR JOHNSON KINDNESS PLLC

(57) ABSTRACT

A gate driving unit and a driving method for the same, a shift register circuit, and a display apparatus, and an operating period of the gate driving unit comprises a first and a second sub-period; a first pull-down node control module in the gate driving unit causes a first pull-down sub-node to be at an inactive level in the second sub-period, and causes the first pull-down sub-node to be at an active level during a reset phase in the first sub-period; a second pull-down node control module causes a second pull-down sub-node to be at an inactive level in the first sub-period, and causes the second pull-down sub-node to be at an active level during a reset phase in the second sub-period. It is possible to shorten the turn-on time of transistors controlled by the first and the second pull-down sub-nodes, and improve the reliability of the gate driving unit.

18 Claims, 7 Drawing Sheets

GATE DRIVING UNIT AND DRIVING METHOD FOR THE SAME, SHIFT REGISTER CIRCUIT, AND DISPLAY APPARATUS

CROSS-REFERENCE TO RELATED APPLICATION

The present application claims priority to Chinese Patent Application No. 202311872343.2, filed on Dec. 29, 2023, the content of which is incorporated herein by reference in its entirety.

TECHNICAL FIELD

The present application relates to the field of display technology, and in particular, to a gate driving unit and a driving method for the same, a shift register circuit, and a display apparatus.

BACKGROUND

Drive devices for a display mainly comprise a shift register circuit and a source drive circuit, where the shift register circuit is configured to provide a gate drive signal to a gate line of a display panel, and the source drive circuit is configured to provide a data drive signal to a data line of the display panel.

Where the shift register circuit comprises a plurality of gate driving units in cascade. Currently, after a gate driving unit operates for a long time, at least a part of the transistors therein may suffer from the problem of threshold voltage drift due to long-time turn-on, affecting the reliability of the shift register circuit.

SUMMARY

In view of this, the present application provides a gate driving unit and a driving method for the same, a shift register circuit, and a display apparatus, to improve the reliability of the gate driving unit.

In a first aspect, an example of the present invention provides a gate driving unit, wherein an operating period of the gate driving unit comprises a first sub-period and a second sub-period, and the first sub-period and the second sub-period each comprise an input phase, an output phase, and a reset phase, the gate driving unit includes a pull-up node control module electrically connected to a pull-up node, the pull-up node control module outputting an active level to the pull-up node during the input phase in response to a signal from a first pull-up control signal terminal, a first pull-down node control module electrically connected to a first pull-down sub-node; the first pull-down node control module configured to cause the first pull-down sub-node to be at an active level during at least a part of the reset phase in the first sub-period, and to cause the first pull-down sub-node to be at an inactive level during the reset phase in the second sub-period, a second pull-down node control module electrically connected to a second pull-down sub-node; the second pull-down node control module configured to cause the second pull-down sub-node to be at an inactive level during the reset phase in the first sub-period, and to cause the second pull-down sub-node to be at an active level during at least a part of the reset phase in the second sub-period, and an output module electrically connected to an output terminal and a first clock signal terminal during the output phase in response to a signal from the pull-up node, electrically connected to the output terminal and a first level signal terminal during at least a part of the reset phase in the second sub-period in response to a signal from the first pull-down sub-node; and electrically connected to the output terminal and the first level signal terminal during at least a part of the reset phase in the first sub-period in response to a signal from the second pull-down sub-node, wherein the first clock signal terminal transmits a clock signal.

In a second aspect, an example of the present invention provides a shift register circuit including a plurality of gate driving units mentioned above which are in cascade, the first clock signal terminal of the gate driving unit of an odd-numbered stage is configured to receive a first clock signal, and the first clock signal terminal of the gate driving unit of an even-numbered stage is configured to receive a second clock signal, and the first clock signal and the second clock signal are periodic pulse signals, the second clock signal is at an inactive level when the first clock signal is at an active level, and the first clock signal is at an inactive level when the second clock signal is at an active level.

In a third aspect, an example of the present invention provides a driving method applied to the foregoing gate driving unit mentioned above, wherein the driving method includes controlling the first pull-down sub-node to be at an active level during at least a part of the reset phase in the first sub-period and the second pull-down sub-node to be at an inactive level during the reset phase in the first sub-period, and controlling the second pull-down sub-node to be at an active level during at least a part of the reset phase in the second sub-period and the first pull-down sub-node to be at an inactive level during the reset phase in the second sub-period.

In a fourth aspect, an example of the present invention provides a display apparatus including the shift register circuit described herein.

BRIEF DESCRIPTION OF DRAWINGS

To describe the technical solutions in the examples of the present application more clearly, the following briefly describes the accompanying drawings required for describing the examples. Apparently, the accompanying drawings in the following description show merely some examples of the present application, and those of ordinary skill in the art may still derive other accompanying drawings from these accompanying drawings without creative efforts.

DESCRIPTION OF EXAMPLES

For a better understanding of the technical solutions of the present application, the following describes in detail the examples of the present application with reference to the accompanying drawings.

It should be noted that the described examples are merely some but not all of the examples of the present application. Based on the examples of the present application, all other examples obtained by a person of ordinary skill in the art without creative efforts fall within the protection scope of the present application Terms in the examples of the present application are merely used to describe the specific examples and are not intended to limit the present application. Unless otherwise specified in the context, words, such as "a", "the", and "this", in a singular form in the examples and appended claims of the present application comprise plural forms.

It should be understood that the term "and/or" used herein merely describes associations between associated objects, and it indicates three types of relationships, for example, A and/or B may indicate A exists alone, A and B coexist, or B exists alone. In addition, the character "/" herein generally indicates that the associated objects are in an "or" relationship.

Figure 1:
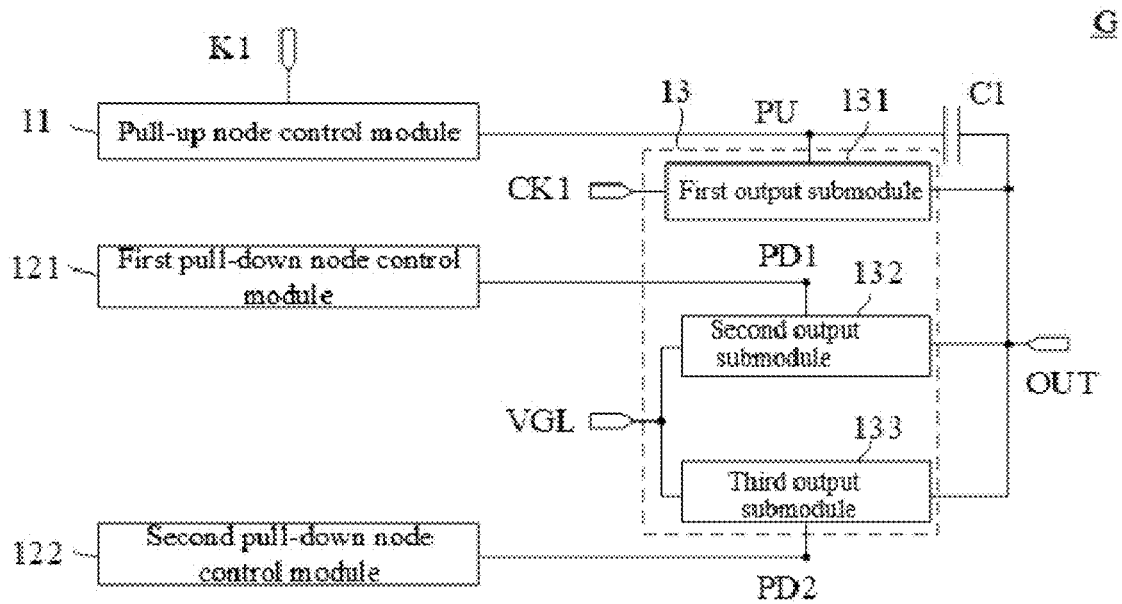
FIG. 1 is a schematic circuit diagram of a gate driving unit provided by an example of the present invention.
Figure 2:
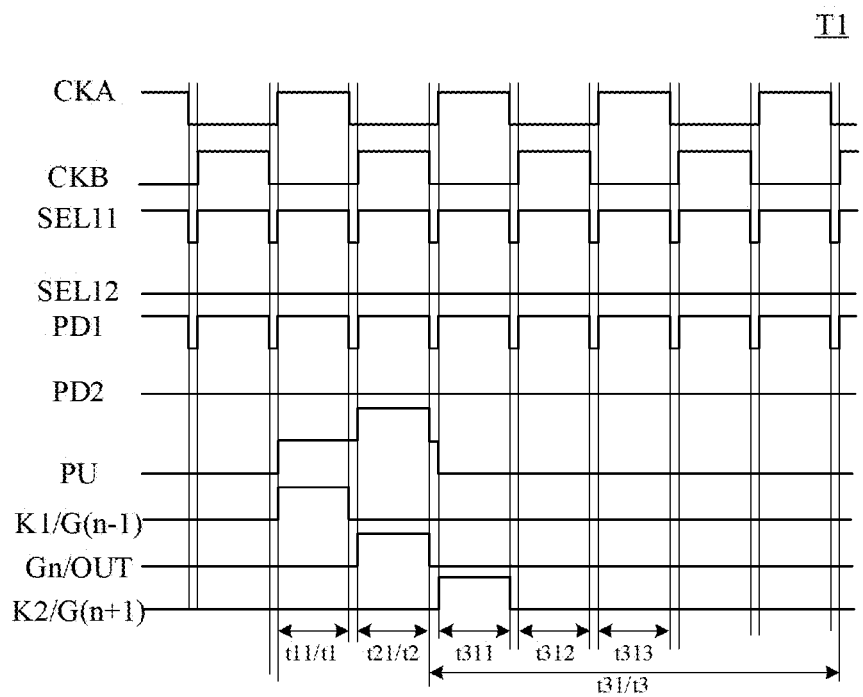
FIG. 2 is an operational timing diagram of a gate driving unit provided by the example of the present invention in a first sub-period.
Figure 3:
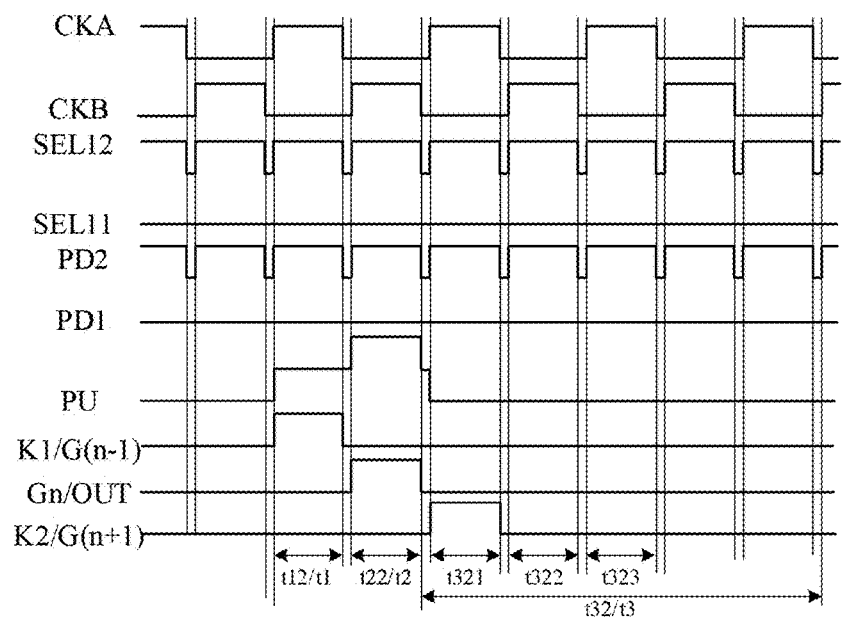
FIG. 3 is an operational timing diagram of a gate driving unit provided by the example of the present invention in a second sub-period.

The examples of the present invention provide a gate driving unit. With reference to FIG. 1, FIG. 2, and FIG. 3, FIG. 1 is a schematic circuit diagram of a gate driving unit provided by an example of the present invention, FIG. 2 is an operational timing diagram of a gate driving unit provided by the example of the present invention in a first sub-period, and FIG. 3 is an operational timing diagram of a gate driving unit provided by the example of the present invention in a second sub-period. An operating period of the gate driving unit G comprises the first sub-period T1 and the second sub-period T2. The first sub-period T1 and the second sub-period T2 each comprise an input phase t1, an output phase t2, and a reset phase t3. FIG. 2 schematically shows that the first sub-period T1 comprises an input phase t11, an output phase t21, and a reset phase t31. FIG. 3 schematically shows that the second sub-period T2 comprises an input phase t12, an output phase t22, and a reset phase t32.

Optionally, the first sub-period T1 may comprise one image frame or a plurality of adjacent image frames. The second sub-period T2 may also comprise one image frame or a plurality of adjacent image frames. The first sub-period T1 is adjacent to the second sub-period T2. For example, the first sub-period T1 and the second sub-period T2 are two adjacent image frames.

Illustratively, as shown in FIG. 1, the gate driving unit G comprises a pull-up node control module 11, a first pull-down node control module 121, and a second pull-down node control module 122. Wherein the pull-up node control module 11 is electrically connected to a pull-up node PU. The pull-up node control module 11 outputs an active level to the pull-up node PU during the input phase in response to a signal from a first pull-up control signal terminal K1. The active level refers to a level capable of turning on a transistor in the gate driving unit G whose gate is electrically connected to the pull-up node PU. For example, when the transistor whose gate is electrically connected to the pull-up node PU comprises an N-type transistor, the active level comprises a high level and an inactive level comprises a low level. When the transistor whose gate is electrically connected to the pull-up node PU comprises a P-type transistor, an inactive level comprises a high level and the active level comprises a low level. Optionally, the first pull-up control signal terminal K1 is configured to provide an active level during the input phase. Under the action of the active level, the pull-up node control module 11 is turned on to provide the active level to the pull-up node PU.

The first pull-down node control module 121 is electrically connected to a first pull-down sub-node PD1; the first pull-down node control module 121 is configured to cause the first pull-down sub-node PD1 to be at an active level during at least a part of the reset phase t31 in the first sub-period T1 and to cause the first pull-down sub-node PD1 to be at an inactive level during the reset phase t31 in the second sub-period T2. Wherein the active level refers to a level capable of turning on a transistor in the gate driving unit G whose gate is electrically connected to the first pull-down sub-node PD1, and the inactive level refers to a level capable of turning off the transistor in the gate driving unit G whose gate is electrically connected to the first pull-down sub-node PD1. For example, when the transistor whose gate is electrically connected to the first pull-down sub-node PD1 comprises an N-type transistor, the inactive level comprises a low level and the active level comprises a high level. When the transistor whose gate is electrically connected to the first pull-down sub-node PD1 comprises a P-type transistor, the inactive level comprises a high level and the active level comprises a low level.

The second pull-down node control module 122 is electrically connected to a second pull-down sub-node PD2; and the second pull-down node control module 122 is configured to cause the second pull-down sub-node PD2 to be at an inactive level during the reset phase t31 in the first sub-period T1 and to cause the second pull-down sub-node PD2 to be at an active level during at least a part of the reset phase t32 in the second sub-period T2. Wherein the active level refers to a level capable of turning on a transistor in the gate driving unit G whose gate is electrically connected to the second pull-down sub-node PD2, and the inactive level refers to a level capable of turning off the transistor in the gate driving unit G whose gate is electrically connected to the second pull-down sub-node PD2. For example, when the transistor whose gate is electrically connected to the second pull-down sub-node PD2 comprises an N-type transistor, the inactive level comprises a low level and the active level comprises a high level. When the transistor whose gate is electrically connected to the second pull-down sub-node PD2 comprises a P-type transistor, the inactive level comprises a high level and the active level comprises a low level.

An output module 13 is electrically connected to an output terminal OUT and a first clock signal terminal CK1 during the output phase t2 in response to a signal from the pull-up node PU, and the first clock signal terminal CK1 transmits a clock signal; wherein the clock signal transmitted by the first clock signal terminal CK1 provides an inactive level during the input phase t1 and provides an active level during the output phase t2, so that the output terminal OUT outputs an active level during the output phase t2. The active level can control, through a gate line in a display region, a corresponding pixel row to be charged. The output module 13 is further electrically connected to the output terminal OUT and a first level signal terminal VGL during at least a part of the reset phase t31 in the first sub-period T1 in response to a signal from the first pull-down sub-node PD1, and electrically connected to the output terminal OUT and the first level signal terminal VGL during at least a part of the reset phase t32 in the second sub-period T2 in response to a signal from the second pull-down sub-node PD2. A first level signal provided by the first level signal terminal VGL refers to a potential capable of resetting a corresponding gate line in the display region such that a corresponding pixel row is kept from being charged. For example, when the gate line receives a high level to control the start of charging of a corresponding subpixel and receives a low level to control the end of charging of the corresponding subpixel, the first level signal refers to a low-level signal.

Illustratively, as shown in FIG. 1, the output module 13 comprises a first output submodule 131, a second output submodule 132, and a third output submodule 133, wherein the first output submodule 131 is electrically connected to the output terminal OUT and the first clock signal terminal CK1 during the output phase t2 in response to the signal from the pull-up node PU. The second output submodule 132 is electrically connected to the output terminal OUT and the first level signal terminal VGL during at least a part of the reset phase t31 in the first sub-period T1 in response to the signal from the first pull-down sub-node PD1. The third output submodule 133 is electrically connected to the output terminal OUT and the first level signal terminal VGL during at least a part of the reset phase t32 in the second sub-period T2 in response to the signal from the second pull-down sub-node PD2.

When the gate driving unit G operates, as shown in FIG. 1, FIG. 2, and FIG. 3, the output terminal OUT outputs an inactive level during the input phase t1. The inactive level can control, through the gate line in the display region, the corresponding pixel row not to be charged. Specifically, the pull-up node control module 11 outputs the active level to the pull-up node PU during the input phase t1 in response to the signal from the first pull-up control signal terminal K1; the first output submodule 131 is electrically connected to the output terminal OUT and the first clock signal terminal CK1 in response to the signal from the pull-up node PU, such that the clock signal transmitted by the first clock signal terminal CK1 can be provided to the output terminal OUT through the output module 13. Illustratively, during the input phase t1, the clock signal transmitted by the first clock signal terminal CK1 may be at an inactive level such that the output terminal OUT outputs an inactive level.

During the output phase t2, the first output submodule 131 is electrically connected to the output terminal OUT and the first clock signal terminal CK1 in response to the signal from the pull-up node PU, such that the clock signal transmitted by the first clock signal terminal CK1 can be provided to the output terminal OUT through the first output submodule 131. Illustratively, during the output phase t2, the clock signal transmitted by the first clock signal terminal CK1 may be at an active level. When a plurality of gate driving units G are cascaded to constitute a shift register circuit, an input phase t1 of the gate driving unit of the current stage may be a period in which the gate driving unit of a previous stage outputs an active level to enable a corresponding gate line in a display panel to control a pixel row to be charged.

During at least a part of the reset phase t31 in the first sub-period T1 and at least a part of the reset phase t32 in the second sub-period T2, the output terminal OUT outputs an inactive level, to reset a corresponding gate line in the display panel, which prevents a case of false charging of a corresponding pixel row.

Specifically, as shown in FIG. 2, during at least a part of the reset phase t31 in the first sub-period T1, the first pull-down node control module 121 causes the first pull-down sub-node PD1 to be at the active level. The second output submodule 132 is turned on in response to the signal from the first pull-down sub-node PD1, to be electrically connected to the output terminal OUT and the first level signal terminal VGL to enable the output terminal OUT to output the first level signal. In addition, during at least a part of the reset phase t31 in the first sub-period T1, the second pull-down node control module 122 causes the second pull-down sub-node PD2 to be at the inactive level. Therefore, each transistor controlled by the second pull-down sub-node PD2 can be in an off state during this phase, which can prevent the problem of threshold voltage drift of the corresponding transistor due to long-time turn-on.

As shown in FIG. 3, during at least a part of the reset phase t32 in the second sub-period T2, the second pull-down node control module 122 causes the second pull-down sub-node PD2 to be at the active level. The third output submodule 133 is turned on in response to the signal from the second pull-down sub-node PD2, to be electrically connected to the output terminal OUT and the first level signal terminal VGL to enable the output terminal OUT to output the first level signal. In addition, at least during at least a part of the reset phase t32 in the second sub-period T2, the first pull-down node control module 121 causes the first pull-down sub-node PD1 to be at the inactive level. Therefore, each transistor controlled by the first pull-down sub-node PD1 can be in the off state, which can prevent the problem of threshold voltage drift of the corresponding transistor due to long-time turn-on.

It can be seen that with the gate driving unit G provided in the example of the present invention, by providing the first pull-down sub-node PD1 and the second pull-down sub-node PD2 as well as the first pull-down node control module 121 and the second pull-down node control module 122 electrically connected to the first pull-down sub-node PD1 and the second pull-down sub-node PD2, respectively, in the gate driving unit, it is possible to use the first pull-down node control module 121 to cause the first pull-down sub-node PD1 to be at the inactive level during at least a part of the reset phase t32 in the second sub-period T2 and to cause the first pull-down sub-node PD1 to be at the active level during at least a part of the reset phase t31 in the first sub-period T1; and it is possible to use the second pull-down node control module 122 to cause the second pull-down sub-node PD2 to be at the inactive level during at least a part of the reset phase t31 in the first sub-period T1 and to cause the second pull-down sub-node PD2 to be at the active level during at least a part of the reset phase t32 in the second sub-period T2; that is, it is possible to cause the first pull-down sub-node PD1 and the second pull-down sub-node PD2 to provide the active level in a time-division manner during the reset phases t3 in the first sub-period T1 and the second sub-period T2 such that the transistors controlled by the first pull-down sub-node PD1 and the second pull-down sub-node PD2 alternately operate in the first sub-period T1 and the second sub-period T2. Compared with the manner of providing only one pull-down node and causing the pull-down node to provide an active level during the reset phases in the first sub-period T1 and the second sub-period T2, in the provision manner provided by the example of the present invention, it is possible to shorten the duration for which the first pull-down sub-node PD1 and the second pull-down sub-node PD2 are at the active level, and thus it is possible to reduce the turn-on duration of the transistors controlled by the first pull-down sub-node PD1 and the second pull-down sub-node PD2, which prevents the problem of threshold voltage drift of the transistors due to long-time turn-on, is conducive to prolonging the service life of the transistors, and improves the reliability of the gate driving unit G.

Figure 4:
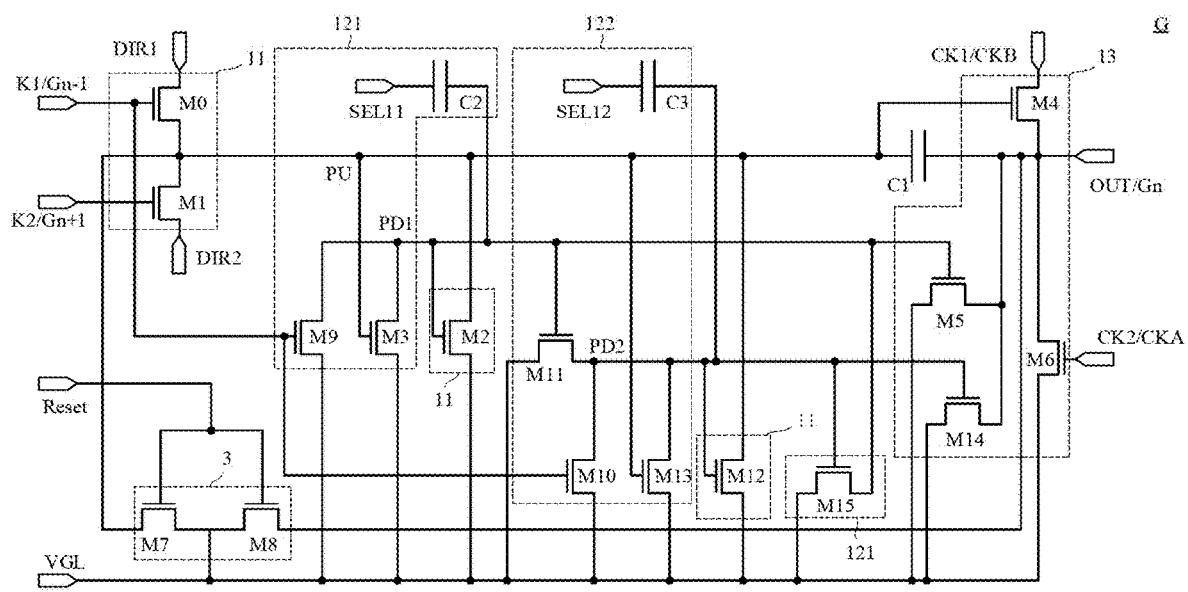
FIG. 4 is a schematic circuit diagram of another gate driving unit provided by an example of the present invention.

Illustratively, as shown in FIG. 1 and FIG. 4, FIG. 4 is a schematic circuit diagram of another gate driving unit provided by an example of the present invention. The gate driving unit G further comprises a first capacitor C1. A first pole of the first capacitor C1 is electrically connected to the output terminal OUT, and a second pole of the first capacitor C1 is electrically connected to the pull-up node PU. In the example of the present invention, during the input phase t1, a pull-up node control module 11 writes a potential at the pull-up node PU to a high level, and at the same time the pull-up node control module 11 charges the first capacitor C1. During the output phase t2, the pull-up node control module 11 is turned off. When the clock signal provided by the the first clock signal terminal CK1 jumps from a low level to a high level, the potential at the pull-up node PU may be pulled up higher under a bootstrap effect of the first capacitor C1, which can ensure that the first output submodule 131 electrically connected to the pull-up node PU can be stably turned on and thus a stable output of the gate driving unit G can be ensured.

Illustratively, as shown in FIG. 4, the pull-up node control module 11 comprises a first pull-up transistor M0, which is electrically connected to a first input signal DIR1 and the pull-up node PU in response to the signal from the first pull-up control signal terminal K1. Illustratively, in the example of the present invention, it is possible to cause a first pull-up control signal provided by the first pull-up control signal terminal K1 to transmit a high level during the input phase t1 and a low level during the output phase t2 and the reset phase t3.

Optionally, as shown in FIG. 4, in the example of the present invention, the pull-up node control module 11 may further comprise a second pull-up transistor M1, which is electrically connected to a second input signal DIR2 and the pull-up node PU in response to a signal from a second pull-up control signal terminal K2. Illustratively, in the example of the present invention, it is possible to cause a second pull-up control signal transmitted by the second pull-up control signal terminal K2 to transmit a low level during both the input phase t1 and the output phase t2 and to provide a high level during the reset phase t3.

Illustratively, as shown in FIG. 4, the output module 13 comprises a first output transistor M4, a second output transistor M5, and a third output transistor M14. Wherein the first output transistor M4 is electrically connected to the output terminal OUT and the first clock signal terminal CK1 in response to the signal from the pull-up node PU.

The second output transistor M5 is electrically connected to the output terminal OUT and the first level signal terminal VGL in response to the signal from the first pull-down sub-node PD1; during at least a part of the reset phase t31 in the first sub-period T1, the first pull-down sub-node PD1 is high, namely at an active level, the second output transistor M5 is turned on, and the output terminal OUT outputs a low level to reset the corresponding gate line; during the reset phase t32 in the second sub-period T2, the first pull-down sub-node PD1 is low, namely at an inactive level, and the second output transistor M5 electrically connected to the first pull-down sub-node PD1 is in an off state, which can prevent the second output transistor M5 from being in a bias state for a long time and is conducive to improving the reliability of the gate driving unit G.

The third output transistor M14 is electrically connected to the output terminal OUT and the first level signal terminal VGL in response to the signal from the second pull-down sub-node PD2; during at least a part of the reset phase t32 in the second sub-period T2, the second pull-down sub-node PD2 is high, namely at an active level, the third output transistor M14 is turned on, and the output terminal OUT outputs a low level to reset the corresponding gate line; during the reset phase t31 in the first sub-period T1, the second pull-down sub-node PD2 is low, namely at an inactive level, and the third output transistor M14 electrically connected to the second pull-down sub-node PD2 is in an off state, which prevents the third output transistor M14 from being in a bias state for a long time and is conducive to improving the reliability of the gate driving unit G.

Illustratively, as shown in FIG. 4, the output module 13 further comprises a fourth output transistor M6, which is electrically connected to the output terminal OUT and the first level signal terminal VGL in response to a signal from a second clock signal terminal CK2. During at least a part of the reset phase t3, a clock signal transmitted by the second clock signal terminal CK2 is at a high level, the fourth output transistor M6 is turned on, and the first level signal provided by the first level signal terminal VGL writes a low level to the output terminal OUT through the fourth output transistor M6, to reset the corresponding gate line.

Figure 5:
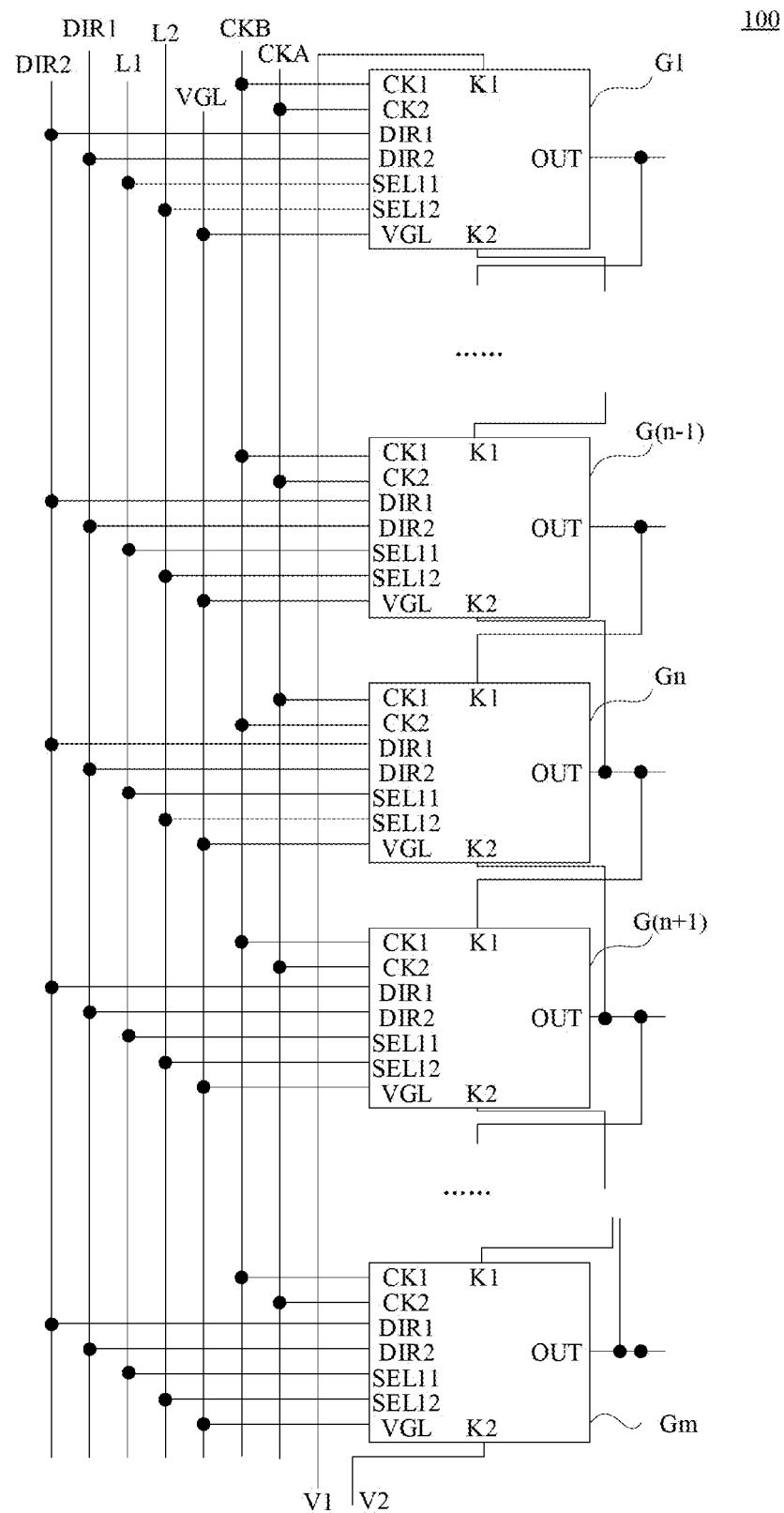
FIG. 5 is a schematic diagram of a shift register circuit provided by an example of the present invention.

Illustratively, as shown in FIG. 5, FIG. 5 is a schematic diagram of a shift register circuit provided by an example of the present invention. When a plurality of gate driving units G are cascaded to form a shift register circuit 100, a first clock signal terminal CK1 of a gate driving unit G of an odd-numbered stage is configured to receive a first clock signal CKB shown in FIG. 2 and FIG. 3 and a second clock signal terminal CK2 of the gate driving unit G is configured to receive a second clock signal CKA shown in FIG. 2 and FIG. 3; and a first clock signal terminal CK1 of a gate driving unit of an even-numbered stage is configured to receive the second clock signal CKA shown in FIG. 2 and FIG. 3 and a second clock signal terminal CK2 of the gate driving unit is configured to receive the first clock signal CKB shown in FIG. 2 and FIG. 3. As shown in FIG. 2 and FIG. 3, when a high level is provided by the first pull-up control signal terminal K1, the first clock signal CKB is at a low level.

As shown in FIG. 2 and FIG. 3, the first clock signal CKB and the second clock signal CKA have a same period, and the second clock signal CKA is at a low level when the first clock signal CKB is at a high level, and the first clock signal CKB is at a low level when the second clock signal CKA is at a high level.

In the example of the present invention, by providing the fourth output transistor M6 that is response to the second clock signal terminal CK2, when the pull-up node PU switches to an inactive level, the fourth output transistor M6 can be quickly turned on under the action of the clock signal provided by the second clock signal terminal CK2 such that the output terminal OUT can quickly output the first level signal, which presents the delay of a falling edge at the output terminal OUT, it is possible to turn off a corresponding pixel in the display region in time to present a display abnormality caused by data mischarging. In addition, in the example of the present invention, the clock signal received by the second clock signal terminal CK2 can frequently switches between high and low levels, and thus it is possible to set the output terminal OUT to a low level by using the fourth output transistor M6 for a plurality of times in a time span of one frame to prevent the output terminal OUT from drafting, which is conducive to improving the accuracy of a signal output by the output terminal OUT.

Alternatively, in the example of the present invention, it is also possible to cause a gate of the fourth output transistor M6 of the gate driving unit of the current stage in the shift register circuit 100 to be electrically connected to the output terminal OUT of the gate driving unit of a next stage. For example, a gate of the fourth output transistor M6 of the gate driving unit Gn of an $n^{th}$ stage is caused to be electrically connected to the output terminal OUT of the gate driving unit G(n+1) of an $(n+1)^{th}$ stage.

Illustratively, as shown in FIG. 4, the pull-up node control module 11 further comprises a third pull-up transistor M2 and a fourth pull-up transistor M12, wherein the third pull-up transistor M2 is electrically connected to the first level signal terminal VGL and the pull-up node PU during at least a part of the reset phase t31 in the first sub-period T1 in response to the signal from the first pull-down sub-node PD1. During at least a part of the reset phase t31 in the first sub-period T1, the first pull-down sub-node PD1 is high, the third pull-up transistor M2 is turned on, and the first level signal provided by the first level signal terminal VGL writes a low level to the pull-up node PU through the third pull-up transistor M2, to denoise the pull-up node PU during at least a part of the reset phase t31 in the first sub-period T1, which ensures that the first output transistor M4 is in an off state to prevent an abnormal output of the output terminal OUT during at least a part of the reset phase t31 in the first sub-period T1, thereby preventing abnormal pixel charging and being conducive to improving the operating accuracy of the gate driving unit G.

The fourth pull-up transistor M12 is electrically connected to the first level signal terminal VGL and the pull-up node PU during at least a part of the reset phase t32 in the second sub-period T2 in response to the signal from the second pull-down sub-node PD2. During at least a part of the reset phase t32 in the second sub-period T2, the second pull-down sub-node PD2 is high, the fourth pull-up transistor M12 is turned on, and the first level signal provided by the first level signal terminal VGL writes a low level to the pull-up node PU through the fourth pull-up transistor M12, to denoise the pull-up node PU during at least a part of the reset phase t32 in the second sub-period T2, which ensures that the first output transistor M4 is in an off state to prevent an abnormal output of the output terminal OUT during at least a part of the reset phase t32 in the second sub-period T2, thereby preventing abnormal pixel charging and being conducive to improving the operating accuracy of the gate driving unit G.

Illustratively, as shown in FIG. 4, the first pull-down node control module 121 further comprises a first pull-down transistor M3, a second pull-down transistor M9, and a third pull-down transistor M15, wherein the first pull-down transistor M3 is electrically connected to the first level signal terminal VGL and the first pull-down sub-node PD1 in response to the signal from the pull-up node PU; during the output phase t2, the pull-up node PU is high, the first pull-down transistor M3 is turned on, and the first level signal provided by the first level signal terminal VGL writes a low level to the first pull-down sub-node PD1 through the first pull-down transistor M3, to denoise the first pull-down sub-node PD1 during the output phase, which prevents the second output transistor M5 from being turned on when the first pull-down sub-node PD1 is at a high level, thereby preventing an abnormal output of the output terminal OUT during the output phase t2.

The second pull-down transistor M9 is electrically connected to the first level signal terminal VGL and the first pull-down sub-node PD1 in response to the signal from the first pull-up control signal terminal K1; during the input phase t1, the first pull-up control signal terminal K1 is at a high level, the second pull-down transistor M9 is turned on, and the first level signal provided by the first level signal terminal VGL writes a low level to the first pull-down sub-node PD1 through the second pull-down transistor M9, to denoise the first pull-down sub-node PD1 during the input phase t1.

The third pull-down transistor M15 is electrically connected to the first level signal terminal VGL and the first pull-down sub-node PD1 in response to the signal from the second pull-down sub-node PD2; during at least a part of the reset phase t32 in the second sub-period T2, the second pull-down sub-node PD2 is at a high level, the third pull-down transistor M15 is turned on, and the first level signal provided by the first level signal terminal VGL writes a low level to the first pull-down sub-node PD1 through the third pull-down transistor M15 such that each transistor controlled by the first pull-down sub-node PD1 can be in an off state, which can prevent the case of threshold voltage drift due to long-time turn-on of the corresponding transistor and be conducive to improving the reliability of the gate driving unit G.

Illustratively, as shown in FIG. 4, the second pull-down node control module 122 further comprises a fourth pull-down transistor M10, a fifth pull-down transistor M11, and a sixth pull-down transistor M13, wherein the fourth pull-down transistor M10 is electrically connected to the first level signal terminal VGL and the second pull-down sub-node PD2 in response to the signal from the first pull-up control signal terminal K1; during the input phase t1, the first pull-up control signal terminal K1 is at a high level, the fourth pull-down transistor M10 is turned on; and the first level signal provided by the first level signal terminal VGL writes a low level to the second pull-down sub-node PD2 through the fourth pull-down transistor M10, to denoise the second pull-down sub-node PD2 during the input phase t1.

The fifth pull-down transistor M11 is electrically connected to the first level signal terminal VGL and the second pull-down sub-node PD2 in response to the signal from the first pull-down sub-node PD1; during at least a part of the reset phase t31 in the first sub-period T1, the first pull-down sub-node PD1 is at a high level, the fifth pull-down transistor M11 is turned on, and the first level signal provided by the first level signal terminal VGL writes a low level to the second pull-down sub-node PD2 through the fifth pull-down transistor M11 such that each transistor controlled by the second pull-down sub-node PD2 can be in an off state, which can prevent the case of threshold voltage drift due to long-time turn-on of the transistor and be conducive to improving the reliability of the gate driving unit G.

The sixth pull-down transistor M13 is electrically connected to the first level signal terminal VGL and the second pull-down sub-node PD2 in response to the signal from the pull-up node PU; during the output phase t2, the pull-up node PU is high, the sixth pull-down transistor M13 is turned on, and the first level signal provided by the first level signal terminal VGL writes a low level to the second pull-down sub-node PD2 through the sixth pull-down transistor M13, to denoise the second pull-down sub-node PD2 during the output phase t2, which prevents that the third output transistor M14 is turned on when the second pull-down sub-node PD2 is at a high level, thereby preventing an abnormal output of the output terminal OUT during the output phase t2.

Illustratively, as shown in FIG. 4, the gate driving unit G further comprises a reset module 3, which comprises a first reset transistor M7 and a second reset transistor M8, wherein the first reset transistor M7 is electrically connected to the first level signal terminal VGL and the pull-up node PU in response to a reset signal RESET; and the second reset transistor M8 is electrically connected to the first level signal terminal VGL and the output terminal OUT in response to the reset signal RESET. Illustratively, the reset signal RESET provides an active level before a start of each frame, to reset the pull-up node PU and the output terminal OUT before the start of each frame and ensure the potential accuracy of the pull-up node PU and the output terminal OUT in a subsequent operating process.

Illustratively, as shown in FIG. 4, the first pull-down node control module 121 comprises a second capacitor C2 electrically connected to the first pull-down sub-node PD1. A first plate of the second capacitor C2 is electrically connected to a first control terminal SEL11 and a second plate of the second capacitor C2 is electrically connected to the first pull-down sub-node PD1. As shown in FIG. 2, the first control terminal SEL11 is configured to provide a first alternating current (AC) signal in the first sub-period T1.

During the reset phase t3, the pull-up node PU is at a low level, and when the second plate of the second capacitor C2 is connected to the first pull-down sub-node PD1, the first AC signal may change a potential at the first pull-down sub-node PD1 under a coupling effect of the second capacitor C2 such that the first pull-down sub-node PD1 is at an active level during at least a part of the reset phase t31 in the first sub-period T1, to control the second output transistor M5 to be turned on, such that the first level provided by the first level signal terminal VGL sets the output terminal OUT to low through the second output transistor M5 that is turned on.

Illustratively, as shown in FIG. 2, in the first sub-period T1, during some phases during which the clock signal received by the second clock signal terminal CK2 of the gate driving unit G is at a low level, for example, when the clock signal received by the first clock signal terminal CK1 switches from a low level to a high level, it is possible to cause the first AC signal received by the first control terminal SEL11 to switch from a low level to a high level in the example of the present invention. In this way, during the phases in the reset phase t3 during which the clock signal provided by the second clock signal terminal CK2 is at a low level, the first AC signal switching from the low level to the high level can pull up the potential at the first pull-down sub-node PD1, so as to control the second output transistor M5 to be turned on.

Illustratively, the reset phase t3 comprises a first reset sub-phase, a second reset sub-phase, and a third reset sub-phase. As shown in FIG. 2, the reset phase t31 in the first sub-period T1 comprises a first reset sub-phase t311, a second reset sub-phase t312, and a third reset sub-phase t313. As shown in FIG. 3, the reset phase t32 in the second sub-period T2 comprises a first reset sub-phase t321, a second reset sub-phase t322, and a third reset sub-phase t323. During the first reset sub-phase, the second reset sub-phase, and the third reset sub-phase, the output terminal OUT outputs an inactive level. Specifically, during the first reset sub-phase, the second pull-up control signal terminal K2 provides a high level and the clock signal transmitted by the second clock signal terminal CK2 is at a high level. During the second reset sub-phase, the second pull-up control signal terminal K2 provides a low level and the clock signal transmitted by the second clock signal terminal CK2 is at a low level. During the third reset sub-phase, the second pull-up control signal terminal K2 provides a low level and the clock signal transmitted by the second clock signal terminal CK2 is at a high level.

In the example of the present invention, it is possible to cause the first AC signal received by the first control terminal SEL11 to switch from a low level to a high level at least during the second reset sub-phase t312 in the first sub-period T1 to pull up the potential at the first pull-down sub-node PD1.

Illustratively, as shown in FIG. 4, the second pull-down node control module 122 comprises a third capacitor C3 electrically connected to the second pull-down sub-node PD2. A first plate of the third capacitor C3 is electrically connected to a second control terminal SEL12 and a second plate of the third capacitor C3 is electrically connected to the second pull-down sub-node PD2. As shown in FIG. 3, the second control terminal SEL12 is configured to provide a second AC signal in the second sub-period T2.

During the reset phase t3, the pull-up node PU is at a low level, and when the second plate of the third capacitor C3 is connected to the second pull-down sub-node PD2, the second AC signal may change a potential at the second pull-down sub-node PD2 under a coupling effect of the third capacitor C3 such that the second pull-down sub-node PD2 is at an active level during at least a part of the reset phase t32 in the second sub-period T2, to control the third output transistor M14 to be turned on, such that the first level provided by the first level signal terminal VGL sets the output terminal OUT to low through the third output transistor M14 that is turned on.

Illustratively, as shown in FIG. 3, in the second sub-period T2, during some phases during which the clock signal received by the second clock signal terminal CK2 of the gate driving unit G is at a low level, for example, when the clock signal received by the first clock signal terminal CK1 switches from a low level to a high level, it is possible to cause the second AC signal received by the second control terminal SEL12 to switch from a low level to a high level in the example of the present invention. In this way, during the phases in the reset phase t3 during which the clock signal provided by the second clock signal terminal CK2 is at a low level, the second AC signal switching from the low level to the high level can pull up the potential at the second pull-down sub-node PD2, to control the third output transistor M14 to be turned on.

In the example of the present invention, it is possible to cause the second AC signal received by the second control terminal SEL12 to switch from a low level to a high level at least during the second reset sub-phase t322 in the second sub-period T2 to pull up the potential at the second pull-down sub-node PD2.

Illustratively, as shown in FIG. 3, in the example of the present invention, it is possible to cause the first control terminal SEL11 to provide a first direct current (DC) signal in the second sub-period T2. According to the characteristic that the second capacitor C2 passes AC but blocks DC, the potential at the first pull-down sub-node PD1 is not affected by the first DC signal in the second sub-period T2. In the example of the present invention, it is possible to cause the potential at the first pull-down sub-node PD1 to be kept at an inactive level in the second sub-period T2 such that the above-mentioned second output transistor M5, third pull-up transistor M2, and fifth pull-down transistor M11 controlled by the first pull-down sub-node PD1 are turned off at least during the reset phase t32 in the second sub-period T2, which prevents the problem of threshold voltage drift of these transistors due to long-time turn-on and can improve the reliability of the gate driving unit G.

Illustratively, during the first reset sub-phase t321 in the second sub-period T2, in the example of the present invention, a low level, namely an inactive level, at the first pull-down sub-node PD1 during the output phase t22 may be maintained through the second capacitor C2. During the second reset sub-phase t322, in the example of the present invention, the second pull-down sub-node PD2 at an active level may control the third pull-down transistor M15 to be turned on, to provide an inactive level to the first pull-down sub-node PD1. During the third reset sub-phase t323, in the example of the present invention, a low level, namely an inactive level, at the first pull-down sub-node PD1 during the second reset sub-phase t322 may be maintained through the second capacitor C2.

It can be seen that in the provision manner provided by the example of the present invention, only the second capacitor C2 electrically connected to the first control terminal SEL11 needs to be provided to control the potentials at the first pull-down sub-node PD1 in the first sub-period T1 and the second sub-period T2, respectively, without the need to provide a transistor to control the potential at the first pull-down sub-node PD1. If the potential at the first pull-down sub-node PD1 is controlled by a transistor, to cause the potential at the first pull-down sub-node PD1 to meet requirements in the first sub-period T1 and the second sub-period T2, respectively, the transistor controlling the potential at the first pull-down sub-node PD1 needs to be caused continuously turned on for a long time in the first sub-period T1 or the second sub-period T2, which will result in the problem of threshold voltage drift due to long-time turn-on of the transistor controlling the potential at the first pull-down sub-node PD1 and impact on the reliability of the gate driving unit G. In the provision manner provided by the example of the present invention, only the second capacitor C2 electrically connected to the first control terminal SEL11 needs to be provided to control the potentials at the first pull-down sub-node PD1 in the first sub-period T1 and the second sub-period T2, respectively, without the need to provide a transistor to control the potential at the first pull-down sub-node PD1, which is conducive to improving the reliability of the gate driving unit G.

Similarly, in the above-mentioned provision manner provided by the example of the present invention, only the third capacitor C3 electrically connected to the second control terminal SEL12 needs to be provided to control the potentials at the second pull-down sub-node PD2 in the first sub-period T1 and the second sub-period T2, respectively, without the need to provide a transistor to control the potential at the second pull-down sub-node PD2. If the potential at the second pull-down sub-node PD2 is controlled by a transistor, to cause the potential at the second pull-down sub-node PD2 to meet requirements in the first sub-period T1 and the second sub-period T2, respectively, the transistor controlling the potential at the second pull-down sub-node PD2 needs to be caused continuously turned on for a long time in the first sub-period T1 or the second sub-period T2, which will result in the problem of threshold voltage drift due to long-time turn-on of the transistor controlling the potential at the second pull-down sub-node PD2 and impact on the reliability of the gate driving unit G. In the provision manner provided by the example of the present invention, only the third capacitor C3 electrically connected to the second control terminal SEL12 needs to be provided to control the potentials at the second pull-down sub-node PD2 in the first sub-period T1 and the second sub-period T2, respectively, without the need to provide a transistor to control the potential at the second pull-down sub-node PD2, which is conducive to improving the reliability of the gate driving unit G.

As shown in FIG. 2, in the example of the present invention, it is possible to cause the second control terminal SEL12 to provide a second DC signal in the first sub-period T1. According to the characteristic that the third capacitor C3 passes AC but blocks DC, the potential at the second pull-down sub-node PD2 is not affected by the second DC signal in the first sub-period T1. In the example of the present invention, it is possible to cause the potential at the second pull-down sub-node PD2 to be kept at an inactive level in the first sub-period T1 such that the above-mentioned fourth pull-up transistor M12, third pull-down transistor M15, and third output transistor M14 controlled by the second pull-down sub-node PD2 are turned off at least during the reset phase t32 in the second sub-period T2, which prevents the problem of threshold voltage drift due to long-time turn-on of these transistors and can improve the reliability of the gate driving unit G.

Illustratively, during the first reset sub-phase t311 in the first sub-period T1, in the example of the present invention, a low level, namely an inactive level, at the second pull-down sub-node PD2 during the output phase t21 may be maintained through the third capacitor C3. During the second reset sub-phase t312, in the example of the present invention, the first pull-down sub-node PD1 at an active level may control the fifth pull-down transistor M11 to be turned on, to provide an inactive level to the second pull-down sub-node PD2. During the third reset sub-phase t313, in the example of the present invention, a low level, namely an inactive level, at the second pull-down sub-node PD2 during the second reset sub-phase t312 may be maintained through the third capacitor C3.

Illustratively, during some phases during which the clock signal received by the first clock signal terminal CK1 of the gate driving unit G is at a low level, for example, when the clock signal received by the second clock signal terminal CK2 switches from a low level to a high level, it is possible to cause the first AC signal received by the first control terminal SEL11 to also switch from a low level to a high level in the example of the present invention, that is, it is possible to cause a period of the first AC signal to be less than a period of the clock signal transmitted by the first clock signal terminal. In the first sub-period T1, both when the clock signal transmitted by the first clock signal terminal CK1 is at a high level and when the clock signal transmitted by the second clock signal terminal CK2 is at a high level, the first AC signal is caused to be at a high level. Because the clock signals received by first clock signal terminals CK1 of gate driving units G of two adjacent stages are phase-inverted signals, in the above-mentioned provision manner, when a plurality of gate driving units are cascaded to form the shift register circuit 100 as shown in FIG. 5, a first control line L1 may be provided in the shift register circuit 100. The first control line L1 provides the first AC signal in the first sub-period T1 and the first DC signal in the second sub-period T2. The first control terminals SEL11 of the gate driving units G of the two adjacent stages each may be electrically connected to the first control line L1 to enable the first pull-down sub-node PD1 of the gate driving unit G of each stage in the shift register circuit 100 to meet requirements in a respective operating process and the number of the wirings in the shift register circuit 100 can be reduced.

Similarly, in the example of the present invention, it is possible to cause a period of the second AC signal to be less than the period of the clock signal transmitted by the first clock signal terminal. In the second sub-period T2, both when the clock signal transmitted by the first clock signal terminal CK1 is at a high level and when the clock signal transmitted by the second clock signal terminal CK2 is at a high level, the second AC signal is caused to be at a high level. Because the clock signals received by first clock signal terminals CK1 of gate driving units G of two adjacent stages are phase-inverted signals, in the above-mentioned provision manner, when a plurality of gate driving units are cascaded to form the shift register circuit 100 as shown in FIG. 5, a second control line L2 may be provided in the shift register circuit 100. The second control line L2 provides the second DC signal in the first sub-period T1 and the second AC signal in the second sub-period T2. The second control terminals SEL12 of the gate driving units G of the two adjacent stages each may be electrically connected to the second control line L2 to enable the second pull-down sub-node PD2 of the gate driving unit G of each stage in the shift register circuit 100 to meet requirements in a respective operating process and the number of the wirings in the shift register circuit 100 can be reduced.

Illustratively, as shown in FIG. 2 and FIG. 3, in the example of the present invention, it is possible to cause the duty cycles of the high levels of the first clock signal CKB and the second clock signal CKA to be less than 50%. As shown in FIG. 2, when both the first clock signal CKB and the second clock signal CKA are at low levels, the first AC signal provided by the first control terminal SEL11 is also at a low level. As shown in FIG. 3, when both the first clock signal CKB and the second clock signal CKA are at low levels, the second AC signal provided by the second control terminal SEL12 is also at a low level. With such a setting, it is possible to cause the first AC signal and the second AC signal each to have a varying potential. The varying potential of the first AC signal may change the potential at the first pull-down sub-node PD1 under the coupling effect of the second capacitor C2, and the varying potential of the second AC signal may change the potential at the second pull-down sub-node PD2 under the coupling effect of the third capacitor C3.

An operating process of the gate driving unit as shown in FIG. 4 in the first sub-period T1 is described below with reference to FIG. 2:

In the first sub-period T1, during the input phase t11, the second pull-up control signal terminal K2 provides a low level, and the second pull-up transistor M1 is turned off. The first pull-up control signal terminal K1 provides a high level, and the first pull-up transistor M0, the second pull-down transistor M9, and the fourth pull-down transistor M10 are turned on. The first input signal DIR1 is at a high level, and the high level provided by the first input signal DIR1 sets the pull-up node PU to high through the first pull-up transistor M0 that is turned on and charges the first capacitor C1.

In response to the high level at the pull-up node PU, the first output transistor M4, the first pull-down transistor M3, and the sixth pull-down transistor M13 are turned on, and the first clock signal CKB provided by the first clock signal terminal CK1 sets the output terminal OUT to low through the first output transistor M4 that is turned on; the first level provided by the first level signal terminal VGL sets the first pull-down sub-node PD1 to low through the first pull-down transistor M3 and the second pull-down transistor M9 that are turned on, the third pull-up transistor M2, the second output transistor M5, and the fifth pull-down transistor M11 are turned off. The first level provided by the first level signal terminal VGL sets the second pull-down sub-node PD2 to low through the fourth pull-down transistor M10 and the sixth pull-down transistor M13 that are turned on. The fourth pull-up transistor M12, the third pull-down transistor M15, and the third output transistor M14 each are turned off.

The second clock signal CKA provided by the second clock signal terminal CK2 is high, the fourth output transistor M6 is turned on, and the first level provided by the first level signal terminal VGL sets the output terminal OUT to low through the fourth output transistor M6 that is turned on.

During the output phase t21, the second pull-up control signal terminal K2 provides a low level, the second pull-up transistor M1 is turned off. The first pull-up control signal terminal K1 provides a low level, the first pull-up transistor M0, the second pull-down transistor M9, and the fourth pull-down transistor M10 are turned off, and the pull-up node PU is kept at the high level under the action of the first capacitor C1; and in response to the high level at the pull-up node PU, the first output transistor M4 is turned on, the first clock signal CKB provided by the first clock signal terminal CK1 sets the output terminal OUT to high through the first output transistor M4 that is turned on, and the potential at the pull-up node PU is coupled to a higher potential under the bootstrap effect of the first capacitor C1.

Under the control of the pull-up node PU, the first pull-down transistor M3 and the sixth pull-down transistor M13 are turned on, the first level provided by the first level signal terminal VGL sets the first pull-down sub-node PD1 and the second pull-down sub-node PD2 to low through the first pull-down transistor M3 and the sixth pull-down transistor M13 that are turned on, respectively. The third pull-up transistor M2, the second output transistor M5, the fifth pull-down transistor M11, the fourth pull-up transistor M12, the third pull-down transistor M15, and the third output transistor M14 each are turned off.

During the first reset sub-phase t311, the second pull-up control signal terminal K2 provides a high level, the second pull-up transistor M1 is turned on, the second input signal DIR2 is written to the pull-up node PU to set the pull-up node PU to low, and the first output transistor M4, the first pull-down transistor M3, and the sixth pull-down transistor M13 each are turned off.

The first pull-up control signal terminal K1 provides a low level, the first pull-up transistor M0, the second pull-down transistor M9, and the fourth pull-down transistor M10 each are turned off.

The second clock signal CKA provided by the second clock signal terminal CK2 is high, the fourth output transistor M6 is turned on, and the first level provided by the first level signal terminal VGL sets the output terminal OUT to low through the fourth output transistor M6 that is turned on.

The second DC signal provided by the second control terminal SEL12 is constantly low in the first sub-period T1, and the potential at the second pull-down sub-node PD2 is not affected by the second control terminal SEL12 in the first sub-period T1.

The first AC signal provided by the first control terminal SEL11 affects the potential at the first pull-down sub-node PD1 through the second capacitor C2. Specifically, during the first reset sub-phase t311, the first AC signal provided by the first control terminal SEL11 switches from a low level to a high level, the potential at the first pull-down sub-node PD1 also changes from low to high. When the potential at the first pull-down sub-node PD1 is high, the third pull-up transistor M2, the second output transistor M5, and the fifth pull-down transistor M11 are each turned on, the first level provided by the first level signal terminal VGL is written to the output terminal OUT through the second output transistor M5 to set the output terminal OUT to low. The first level provided by the first level signal terminal VGL is written to the pull-up node PU through the third pull-up transistor M2 to set the pull-up node PU to low. The first level provided by the first level signal terminal VGL is written to the second pull-down sub-node PD2 through the fifth pull-down transistor M11 to set the second pull-down sub-node PD2 to low. The fourth pull-up transistor M12, the third pull-down transistor M15, and the third output transistor M14 each are turned off, which can prevent the problem of threshold voltage drift due to long-time turn-on of each of the fourth pull-up transistor M12, the third pull-down transistor M15, and the third output transistor M14 and is conducive to improving the reliability of the gate driving unit.

During the second reset sub-phase t312, the first pull-up control signal terminal K1 provides a low level, the first pull-up transistor M0, the second pull-down transistor M9, and the fourth pull-down transistor M10 are turned off, the second pull-up control signal terminal K2 provides a low level, and the second pull-up transistor M1 is turned off. The pull-up node PU is kept at the low level under the action of the first capacitor C1, and the first output transistor M4, the first pull-down transistor M3, and the sixth pull-down transistor M13 each are turned off.

The second clock signal CKA provided by the second clock signal terminal CK2 is low, and the fourth output transistor M6 is turned off.

During the second reset sub-phase t312, the first AC signal provided by the first control terminal SEL11 switches from a low level to a high level, the potential at the first pull-down sub-node PD1 also changes from low to high. When the first pull-down sub-node PD1 is high, the third pull-up transistor M2, the second output transistor M5, and the fifth pull-down transistor M11 each are turned on, the first level provided by the first level signal terminal VGL is written to the output terminal OUT through the second output transistor M5 to set the output terminal OUT to low. The first level provided by the first level signal terminal VGL is written to the pull-up node PU through the third pull-up transistor M2 to set the pull-up node PU to low. The first level provided by the first level signal terminal VGL is written to the second pull-down sub-node PD2 through the fifth pull-down transistor M11 to set the second pull-down sub-node PD2 to low. The fourth pull-up transistor M12, the third pull-down transistor M15, and the third output transistor M14 each are turned off, which can prevent the problem of threshold voltage drift due to long-time turn-on of each of the fourth pull-up transistor M12, the third pull-down transistor M15, and the third output transistor M14 and is conducive to improving the reliability of the gate driving unit.

Subsequently, come into the third reset sub-phase t313, during which, the first pull-up control signal terminal K1 provides a low level, the first pull-up transistor M0, the second pull-down transistor M9, and the fourth pull-down transistor M10 are turned off, the second pull-up control signal terminal K2 provides a low level, and the second pull-up transistor M1 is turned off. The pull-up node PU is kept at the low level under the action of the first capacitor C1, and the first output transistor M4, the first pull-down transistor M3, and the sixth pull-down transistor M13 each are turned off.

During the third reset sub-phase t313, the first AC signal provided by the first control terminal SEL11 switches from a low level to a high level, the potential at the first pull-down sub-node PD1 also changes from low to high. When the first pull-down sub-node PD1 is at a high level, the third pull-up transistor M2, the second output transistor M5, and the fifth pull-down transistor M11 are turned on, the first level provided by the first level signal terminal VGL is written to the output terminal OUT through the second output transistor M5 to set the output terminal OUT to low. The first level provided by the first level signal terminal VGL is written to the pull-up node PU through the third pull-up transistor M2 to set the pull-up node PU to low. The first level provided by the first level signal terminal VGL is written to the second pull-down sub-node PD2 through the fifth pull-down transistor M11 to set the second pull-down sub-node PD2 to low. The fourth pull-up transistor M12, the third pull-down transistor M15, and the third output transistor M14 each are turned off, which can prevent the problem of threshold voltage drift due to long-time turn-on of the fourth pull-up transistor M12, the third pull-down transistor M15, and the third output transistor M14 and is conducive to improving the reliability of the gate driving unit.

The second clock signal CKA provided by the second clock signal terminal CK2 is high, the fourth output transistor M6 is turned on, the first level provided by the first level signal terminal VGL sets the output terminal OUT to low through the fourth output transistor M6 that is turned on.

Thereafter, the gate driving unit G repeatedly performs the operations during the second reset sub-phase t312 and third reset sub-phase t313 until a next frame of a scanned image arrives and starts performing the above-mentioned operations during the input phase t1 when the next frame arrives and the gate driving unit of a previous stage outputs a high level.

An operating process of the gate driving unit G as shown in FIG. 4 in the second sub-period T2 is described below with reference to FIG. 3:

The operations of the pull-up module 11 and the output module 13 in the gate driving unit G as shown in FIG. 4 during the input phase t12 and the output phase t22 in the second sub-period T2 are respectively the same as their operations during the input phase t11 and the output phase t21 in the first sub-period T1 and are not described herein again.

Different from the operations in the first sub-period T1, as shown in FIG. 3, in the second sub-period T2, the first control terminal SEL11 provides the first DC signal in the second sub-period T2, and the potential at the first pull-down sub-node PD1 is not affected by the second capacitor C2 in the second sub-period T2. The second control terminal SEL12 provides the second AC signal in the second sub-period T2, and the second AC signal affects the potential at the second pull-down sub-node PD2 through the third capacitor C3.

Because the second AC signal switches from low to high during each of the first reset sub-phase t321, the second reset sub-phase t322, and the third reset sub-phase t323, the potential at the second pull-down sub-node PD2 also changes from low to high during each of the first reset sub-phase t321, the second reset sub-phase t322, and the third reset sub-phase t323, and the fourth pull-up transistor M12, the third pull-down transistor M15, and the third output transistor M14 each are turned on. The first level provided by the first level signal terminal VGL is written to the output terminal OUT through the third output transistor M14 to set the output terminal OUT to low. The first level provided by the first level signal terminal VGL is written to the pull-up node PU through the fourth pull-up transistor M12 to set the pull-up node PU to low. The first level provided by the first level signal terminal VGL is written to the first pull-down sub-node PD1 through the third pull-down transistor M15 to set the first pull-down sub-node PD1 to low. The third pull-up transistor M2, the second output transistor M5, and the fifth pull-down transistor M11 each are turned off, which can prevent the problem of threshold voltage drift due to long-time turn-on of each of the third pull-up transistor M2, the second output transistor M5, and the fifth pull-down transistor M11.

Figure 6:
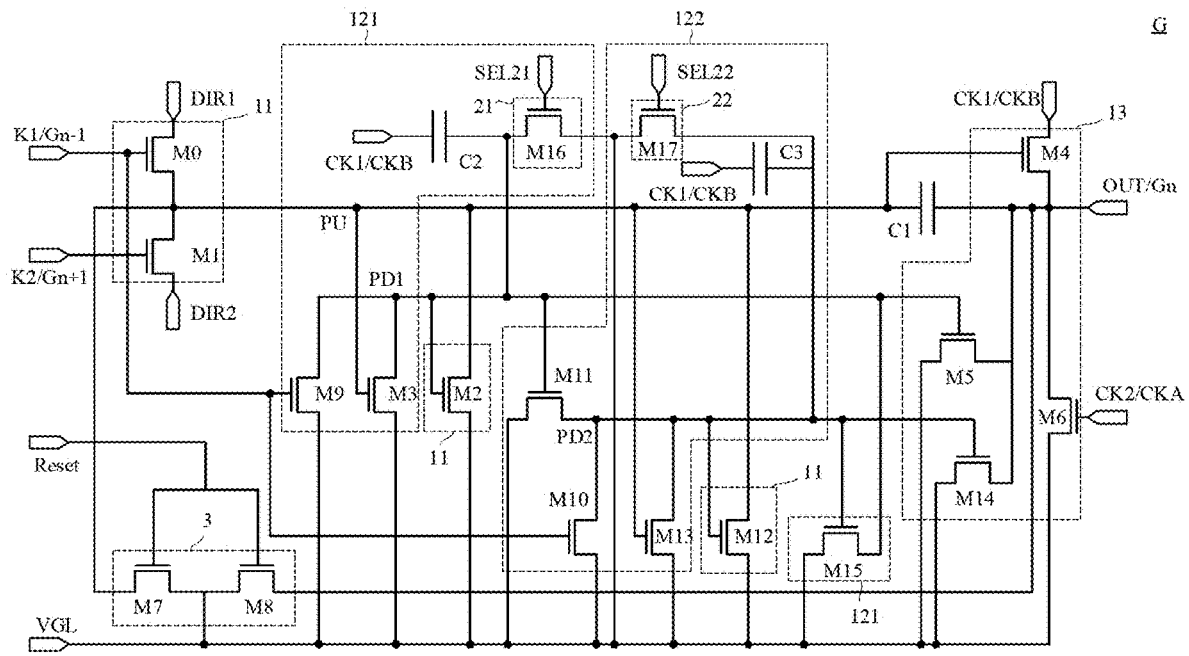
FIG. 6 is a schematic circuit diagram of still another gate driving unit provided by an example of the present invention.

Illustratively, as shown in FIG. 6, FIG. 6 is a schematic circuit diagram of still another gate driving unit provided by an example of the present invention. In the example of the present invention, it is possible to cause the first plate of the second capacitor C2 and the first plate of the third capacitor C3 to be electrically connected to the first clock signal terminal CK1 of the gate driving unit G, that is, it is possible to cause the clock signal received by the first clock signal terminal CK1 of the gate driving unit G to be reused as the above-mentioned first AC signal and second AC signal in the first sub-period T1 and the second sub-period T2, respectively.

As shown in FIG. 6, the first pull-down node control module 121 further comprises a first selection unit 21, which is configured to be electrically connected to the first level signal terminal VGL and the first pull-down sub-node PD1 under the control of a first selection terminal SEL21; and the first selection terminal SEL21 is configured to provide an inactive level in the first sub-period T1, the first selection unit 21 is turned off under the action of the inactive level, the first level signal provided by the first level signal terminal VGL is not written to the first pull-down sub-node PD1 through the first selection unit 21, and the clock signal transmitted by the first clock signal terminal CK1 affects the potential at the first pull-down sub-node PD1 under the coupling effect of the second capacitor C2. That is, during at least a part of the reset phase t31 in the first sub-period T1, the potential at the first pull-down sub-node PD1 varies with the clock signal provided by the first clock signal terminal CK1.

The first selection terminal SEL21 is further configured to provide an active level in the second sub-period T2, the first selection unit 21 is turned on under the action of the active level, and the first level signal provided by the first level signal terminal VGL is written to the first pull-down sub-node PD1 through the first selection unit 21. That is, the potential at the first pull-down sub-node PD1 is constantly at a low level in the second sub-period T2, to control the third pull-up transistor M2, the second output transistor M5, and the fifth pull-down transistor M11 each to be turned off, so as to prevent threshold voltage drift due to long-time turn-on of each of the third pull-up transistor M2, the second output transistor M5, and the fifth pull-down transistor M11.

Illustratively, as shown in FIG. 6, the first selection unit 21 comprises a first selection transistor M16. A gate of the first selection transistor M16 is electrically connected to the first selection terminal SEL21, a first electrode of the first selection transistor M16 is electrically connected to the first level signal terminal VGL, and a second electrode of the first selection transistor M16 is electrically connected to the first pull-down sub-node PD1. One of the first electrode and the second electrode is a source and the other is a drain.

As shown in FIG. 6, the second pull-down node control module 122 further comprises a second selection unit 22, which is configured to be electrically connected to the first level signal terminal VGL and the second pull-down sub-node PD2 under the control of a second selection terminal SEL22; and the second selection terminal SEL22 is configured to provide an active level in the first sub-period T1. The second selection unit 22 is turned on under the action of the active level, the first level signal provided by the first level signal terminal VGL is written to the second pull-down sub-node PD2 through the second selection unit 22, that is, the potential at the second pull-down sub-node PD2 is constantly at a low level in the second sub-period T2, to control the fourth pull-up transistor M12, the third pull-down transistor M15, and the third output transistor M14 to be turned off, so as to prevent threshold voltage shift due to long-time turn-on of each of the fourth pull-up transistor M12, the third pull-down transistor M15, and the third output transistor M14.

The second selection terminal SEL22 is further configured to provide an inactive level in the second sub-period T2, the second selection unit 22 is turned off under the action of the inactive level, the first level signal provided by the first level signal terminal VGL is not written to the second pull-down sub-node PD2 through the second selection unit 22. The clock signal transmitted by the first clock signal terminal CK1 affects the potential at the second pull-down sub-node PD2 under the coupling effect of the third capacitor C3. That is, during at least a part of the reset phase t32 in the second sub-period T2, the potential at the second pull-down sub-node PD2 varies with the clock signal provided by the first clock signal terminal CK1.

Illustratively, as shown in FIG. 6, the second selection unit 22 comprises a second selection transistor M17. A gate of the second selection transistor M17 is electrically connected to the second selection terminal SEL22, a first electrode of the second selection transistor M17 is electrically connected to the first level signal terminal VGL, and a second electrode of the second selection transistor M17 is electrically connected to the second pull-down sub-node PD2. One of the first electrode and the second electrode is a source and the other is a drain.

Figure 7:
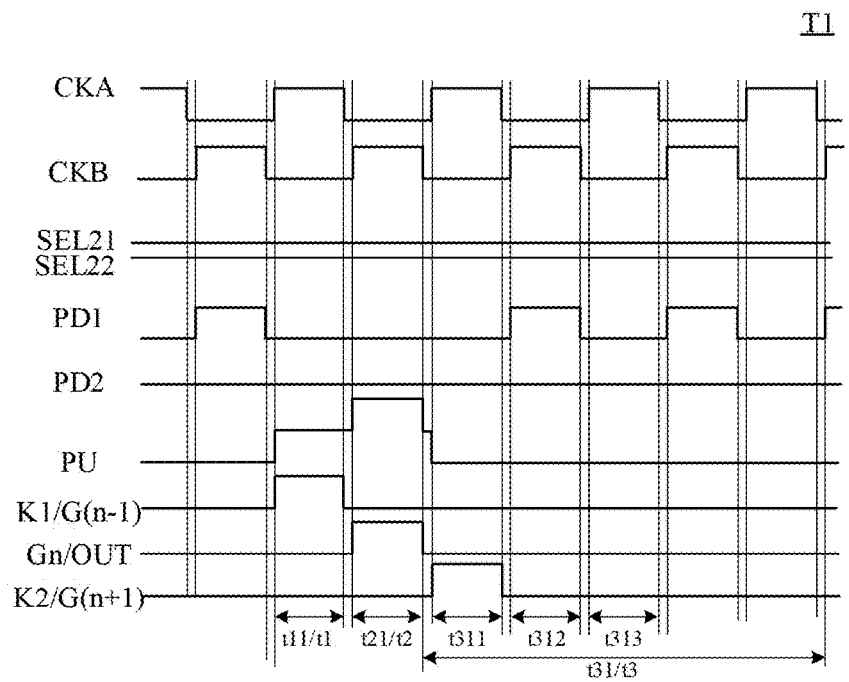
FIG. 7 is an operational timing diagram of another gate driving unit provided by an example of the present invention in a first sub-period.

An operating process of the gate driving unit G as shown in FIG. 6 in the first sub-period T1 is described below with reference to FIG. 7. FIG. 7 is an operational timing diagram of another gate driving unit G provided by an example of the present invention in a first sub-period.

The operating processes of the pull-up module 11 and the output module 13 in the gate driving unit G as shown in FIG. 6 during the input phase t11 and the output phase t21 in the first sub-period T1 are respectively the same as those in the above-mentioned gate driving unit G as shown in FIG. 4 during the input phase t11 and the output phase t21 in the first sub-period T1, and are not described herein again.

In the gate driving unit G as shown in FIG. 6, in the first sub-period T1, the second selection terminal SEL22 is constantly high, the second selection transistor M17 is turned on, the first level signal terminal VGL sets the second pull-down sub-node PD2 to low through the second selection transistor M17 that is turned on, and the fourth pull-up transistor M12, the third pull-down transistor M15, and the third output transistor M14 each are turned off. That is, the transistors controlled by the second pull-down sub-node PD2 are in the off state, which can prevent the problem of threshold voltage drift due to long-time turn-on of each of the fourth pull-up transistor M12, the third pull-down transistor M15, and the third output transistor M14.

The first selection terminal SEL21 is constantly low, the first selection transistor M16 is turned off. The first level signal provided by the first level signal terminal VGL is not written to the first pull-down sub-node PD1 through the first selection transistor M16. The clock signal provided by the first clock signal terminal CK1 affects the potential at the first pull-down sub-node PD1 through the second capacitor C2. Specifically, a potential of the clock signal provided by the first clock signal terminal CK1 changes from high to low during the first reset sub-phase t311, and thus the potential at the first pull-down sub-node PD1 is coupled to low, when the potential at the first pull-down sub-node PD1 is low, the third pull-up transistor M2, the second output transistor M5, and the fifth pull-down transistor M11 each are turned off. During the first reset sub-phase t311, the second clock signal CKA received by the second clock signal terminal CK2 is high, the fourth output transistor M6 is turned on, and the output terminal OUT can output a reset signal to the corresponding gate line.

The potential of the clock signal provided by the first clock signal terminal CK1 changes from low to high during the second reset sub-phase t312, and the potential at the first pull-down sub-node PD1 also changes from low to high. When the potential at the first pull-down sub-node PD1 is high, the third pull-up transistor M2, the second output transistor M5, and the fifth pull-down transistor M11 each are turned on, the first level provided by the first level signal terminal VGL is written to the output terminal OUT through the second output transistor M5 to set the output terminal OUT to low, to provide a reset signal to the corresponding gate line. The first level provided by the first level signal terminal VGL is written to the pull-up node PU through the third pull-up transistor M2 to set the pull-up node PU to low. The first level provided by the first level signal terminal VGL is written to the second pull-down sub-node PD2 through the fifth pull-down transistor M11 to set the second pull-down sub-node PD2 to low, so as to ensure that the fourth pull-up transistor M12, the third pull-down transistor M15, and the third output transistor M14 each are turned off.

The potential of the clock signal provided by the first clock signal terminal CK1 changes from high to low during the third reset sub-phase t313, the potential at the first pull-down sub-node PD1 also changes from high to low, and when the potential at the first pull-down sub-node PD1 is low, the third pull-up transistor M2, the second output transistor M5, and the fifth pull-down transistor M11 each are turned off. During the third reset sub-phase t313, the second clock signal CKA received by the second clock signal terminal CK2 is high, the fourth output transistor M6 is turned on, and the output terminal OUT can output a reset signal to the corresponding gate line.

Thereafter, the gate driving unit G repeatedly performs the operations during the second reset sub-phase t312 and third reset sub-phase t313 until a next frame of a scanned image arrives and starts performing the operations during the input phase t1 when the next frame arrives and the gate driving unit G of a previous stage outputs a high level.

Figure 8:
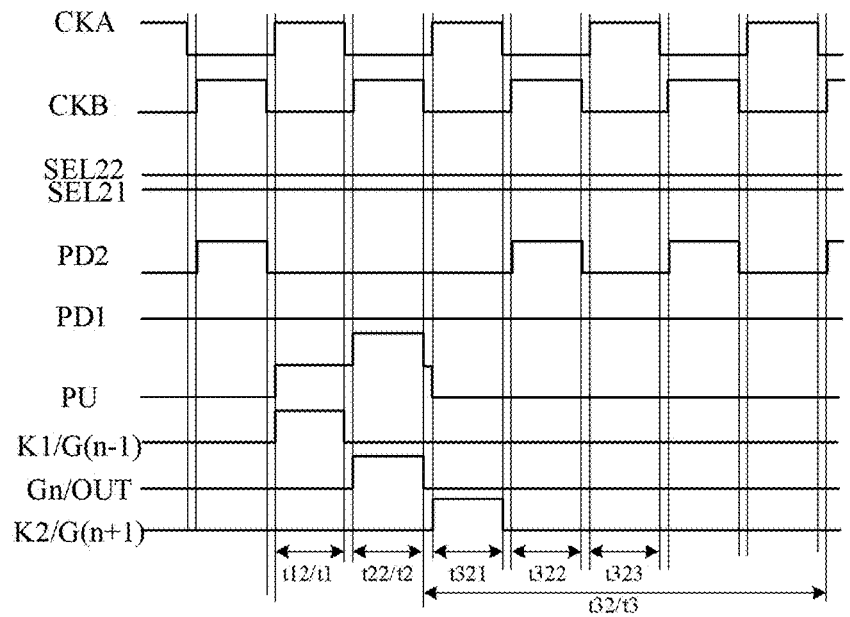
FIG. 8 is an operational timing diagram of another gate driving unit provided by an example of the present invention in a second sub-period.

An operating process of the gate driving unit G as shown in FIG. 6 in the second sub-period T2 is described below with reference to FIG. 8, and FIG. 8 is an operational timing diagram of another gate driving unit G provided by an example of the present invention.

The operations of the pull-up module 11 and the output module 13 in the gate driving unit G as shown in FIG. 6 during the input phase t21 and the output phase t22 in the second sub-period T2 are respectively the same as those of the pull-up module 11 and the output module 13 in the gate driving unit G as shown in FIG. 4 during the input phase t11 and the output phase t21 in the above-mentioned first sub-period T1, and are not described herein again.

Different from the operating process of the gate driving unit G as shown in FIG. 4 in the first sub-period T1, as shown in FIG. 8, in the gate driving unit G as shown in FIG. 6, the first selection terminal SEL21 is constantly high in the second sub-period T2, the first selection transistor M16 is turned on, the first level provided by the first level signal terminal VGL is written to the first pull-down sub-node PD1 through the first selection transistor M16 that is turned on, that is, the first pull-down sub-node PD1 is constantly low in the second sub-period T2, the third pull-up transistor M2, the second output transistor M5, and the fifth pull-down transistor M11 are turned off, which can prevent the problem of threshold voltage drift due to long-time turn-on of each of the third pull-up transistor M2, the second output transistor M5, and the fifth pull-down transistor M11.

The second selection terminal SEL22 is constantly low, the second selection transistor M17 is turned off, and the first level signal provided by the first level signal terminal VGL may not be written to the second pull-down sub-node PD2 through the second selection transistor M17. The clock signal provided by the first clock signal terminal CK1 affects the second pull-down sub-node PD2 through the third capacitor C3. Specifically, a potential of the clock signal provided by the first clock signal terminal CK1 changes from high to low during the first reset sub-phase t321, the potential at the second pull-down sub-node PD2 is coupled to low, and when the potential at the second pull-down sub-node PD2 is low, the fourth pull-up transistor M12, the third pull-down transistor M15, and the third output transistor M14 each are turned off.

During the first reset sub-phase t321, the second clock signal CKA received by the second clock signal terminal CK2 is high, the fourth output transistor M6 is turned on, and the output terminal OUT can output a reset signal to the corresponding gate line.

The potential of the clock signal provided by the first clock signal terminal CK1 changes from low to high during the second reset sub-phase t322, and thus the potential at the second pull-down sub-node PD2 also changes from low to high, the fourth pull-up transistor M12, the third pull-down transistor M15, and the third output transistor M14 each are turned on, the first level provided by the first level signal terminal VGL is written to the pull-up node PU through the fourth pull-up transistor M12 that is turned on, to reset and denoise the pull-up node PU; and the first level provided by the first level signal terminal VGL is written to the output terminal OUT through the third output transistor M14 that is turned on, to set the output terminal OUT to low to provide a reset signal to the corresponding gate line. The first level provided by the first level signal terminal VGL is written to the first pull-down sub-node PD1 through the third pull-down transistor M15 that is turned on. The third pull-up transistor M2, the second output transistor M5, and the fifth pull-down transistor M11 each are turned off.

The potential of the clock signal provided by the first clock signal terminal CK1 changes from high to low during the third reset sub-phase t323, and thus the second pull-down sub-node PD2 is also coupled to a low level during the third reset sub-phase t323. The fourth pull-up transistor M12, the third pull-down transistor M15, and the third output transistor M14 each are turned off.

During the third reset sub-phase t323, the second clock signal CKA received by the second clock signal terminal CK2 is high, the fourth output transistor M6 is turned on, and the output terminal OUT can output a reset signal to the corresponding gate line.

Thereafter, the gate driving unit G repeatedly performs the operations during the second reset sub-phase t322 and third reset sub-phase t323 until a next frame of a scanned image arrives, and starts performing the above-mentioned operations during the input phase t1 when the next frame arrives and the gate driving unit G of a previous stage outputs a high level.

Figure 9:
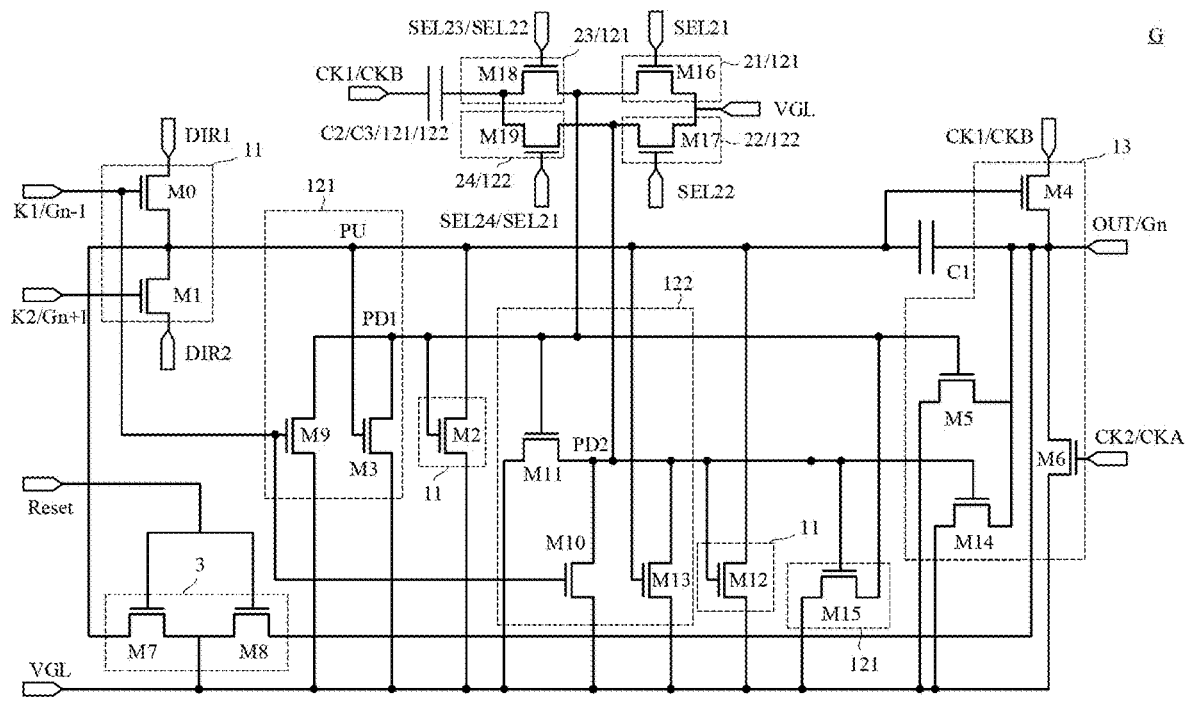
FIG. 9 is a schematic circuit diagram of yet another gate driving unit provided by an example of the present invention.

Illustratively, as shown in FIG. 9, FIG. 9 is a schematic circuit diagram of yet another gate driving unit provided by an example of the present invention. The first pull-down node control module 121 further comprises a third selection unit 23, which is electrically connected to the second plate of the second capacitor C2 and the first pull-down sub-node PD1 in the first sub-period T1 in response to a signal from a third selection terminal SEL23; and illustratively, as shown in FIG. 9, the third selection unit 23 comprises a third selection transistor M18, a gate of the third selection transistor M18 is electrically connected to the third selection terminal SEL23, a first electrode of the third selection transistor M18 is electrically connected to the second plate of the second capacitor C2, and a second electrode of the third selection transistor M18 is electrically connected to the first pull-down sub-node PD1. One of the first electrode and the second electrode is a source and the other is a drain.

The second pull-down node control module 122 further comprises a fourth selection unit 24. The fourth selection unit 24 is electrically connected to the second plate of the second capacitor C2 and the second pull-down sub-node PD2 in the second sub-period T2 in response to a signal from a fourth selection terminal SEL24; and illustratively, the fourth selection unit 24 comprises a fourth selection transistor M19, a gate of the fourth selection transistor M19 is electrically connected to the fourth selection terminal SEL24, a first electrode of the fourth selection transistor M19 is electrically connected to the second plate of the second capacitor C2, and a second electrode of the fourth selection transistor M19 is electrically connected to the second pull-down sub-node PD2. One of the first electrode and the second electrode is a source and the other is a drain.

The third selection terminal SEL23 is configured to provide an active level in the first sub-period T1 and provide an inactive level in the second sub-period T2; and the fourth selection terminal SEL24 is configured to provide an inactive level in the first sub-period T1 and provide an active level in the second sub-period T2.

In the example of the present invention, the second plate of the second capacitor C2 is caused to be electrically connected to the first pull-down sub-node PD1 and the second pull-down sub-node PD2 through the third selection unit 23 and the fourth selection unit 24, respectively. Wherein the third selection unit 23 and the fourth selection unit 24 are turned on in the first sub-period T1 and the second sub-period T2, respectively, which is equivalent to reusing the second capacitor C2 as the above-mentioned third capacitor C3, and the provision of the third capacitor C3 can be omitted, which can simplify a circuit structure of the gate driving unit G, and reduce load of the clock signal transmitted by the first clock signal terminal CK1 of the gate driving unit G and power consumption.

Illustratively, the above-mentioned second selection terminal SEL22 may be reused as the third selection terminal SEL23, and the above-mentioned first selection terminal SEL21 may be reused as the fourth selection terminal SEL24.

An operating process of the gate driving unit G as shown in FIG. 9 in the first sub-period T1 is described below with reference to FIG. 6:

The operations of the pull-up module 11 and the output module 13 in the gate driving unit G as shown in FIG. 9 during the input phase t11 and the output phase t21 in the first sub-period T1 are respectively the same as those in the above-mentioned gate driving unit G as shown in FIG. 4 during the input phase t11 and the output phase t21 in the first sub-period T1, and are not described herein again.

Different from the gate driving unit G as shown in FIG. 4, for the gate driving unit G as shown in FIG. 9, in the first sub-period T1, the first selection terminal SEL21 is constantly at a low level, and the first selection transistor M16 and the fourth selection transistor M19 are turned off. The third selection terminal SEL23 is constantly at a high level, and the second selection transistor M17 and the third selection transistor M18 are turned on. The first level signal provided by the first level signal terminal VGL is written to the second pull-down sub-node PD2 through the second selection transistor M17 that is turned on, to set the second pull-down sub-node PD2 to low, and the fourth pull-up transistor M12, the third pull-down transistor M15, and the third output transistor M14 each are turned off, which can shorten the turn-on time of the fourth pull-up transistor M12, the third pull-down transistor M15, and the third output transistor M14, to prevent the problem of threshold voltage drift due to long-time turn-on.

The clock signal provided by the first clock signal terminal CK1 affects the potential at the first pull-down sub-node PD1 through the second capacitor C2 and the third selection transistor M18 that is turned on. Specifically, the potential of the clock signal provided by the first clock signal terminal CK1 changes from high to low during the first reset sub-phase t311, and the potential at the first pull-down sub-node PD1 is coupled to low. The third pull-up transistor M2, the second output transistor M5, and the fifth pull-down transistor M11 each are turned off.

During the first reset sub-phase t311, the second clock signal CKA received by the second clock signal terminal CK2 is high, the fourth output transistor M6 is turned on, and the output terminal OUT can normally output a reset signal to the corresponding gate line.

The potential of the clock signal provided by the first clock signal terminal CK1 changes from low to high during the second reset sub-phase t312, and the potential at the first pull-down sub-node PD1 also changes from low to high. When the potential at the first pull-down sub-node PD1 is high, the third pull-up transistor M2, the second output transistor M5, and the fifth pull-down transistor M11 each are turned on, the first level provided by the first level signal terminal VGL is written to the output terminal OUT through the second output transistor M5 to set the output terminal OUT to low, to provide a reset signal to the corresponding gate line. The first level provided by the first level signal terminal VGL is written to the pull-up node PU through the third pull-up transistor M2 to set the pull-up node PU to low, and the first level provided by the first level signal terminal VGL is written to the second pull-down sub-node PD2 through the fifth pull-down transistor M11 to set the second pull-down sub-node PD2 to low. The fourth pull-up transistor M12, the third pull-down transistor M15, and the third output transistor M14 each are turned off.

The potential of the clock signal provided by the first clock signal terminal CK1 changes from high to low during the third reset sub-phase t313, and the potential at the first pull-down sub-node PD1 also changes from high to low.

When the potential at the first pull-down sub-node PD1 is low, the third pull-up transistor M2, the second output transistor M5, and the fifth pull-down transistor M11 each are turned off.

During the third reset sub-phase t313, the second clock signal CKA received by the second clock signal terminal CK2 is at a high level, the fourth output transistor M6 is turned on, and the output terminal OUT can normally output a reset signal to the corresponding gate line.

Thereafter, the gate driving unit G repeatedly performs the operations during the second reset sub-phase t312 and third reset sub-phase t313 until a next frame of a scanned image arrives and starts performing the above-mentioned operations during the input phase when the next frame arrives and the gate driving unit G of a previous stage outputs a high level.

An operating process of the gate driving unit G as shown in FIG. 9 in the second sub-period T2 is described below with reference to FIG. 8:

The operations of the pull-up module 11 and the output module 13 in the gate driving unit G as shown in FIG. 9 during the input phase t12 and the output phase t22 in the second sub-period T2 are respectively the same as those of the pull-up module 11 and the output module 13 in the gate driving unit G as shown in FIG. 4 during the input phase t11 and the output phase t21 in the above-mentioned second sub-period T2, and are not described herein again.

Different from the gate driving unit G as shown in FIG. 4, for the gate driving unit G as shown in FIG. 9, in the second sub-period T2, the fourth selection terminal SEL24, namely the first selection terminal SEL21, is constantly at a high level, and the first selection transistor M16 and the fourth selection transistor M19 are turned on. The second selection terminal SEL22, namely the third selection terminal SEL23, is constantly at a low level, and the second selection transistor M17 and the third selection transistor M18 are turned off.

The first level signal provided by the first level signal terminal VGL is written to the first pull-down sub-node PD1 through the first selection transistor M16 that is turned on. That is, the first pull-down sub-node PD1 is constantly at low in the second sub-period T2, and the third pull-up transistor M2, the second output transistor M5, and the fifth pull-down transistor M11 each are turned off.

The first level signal provided by the first level signal terminal VGL may not be written to the second pull-down sub-node PD2 through the second selection transistor M17. The clock signal provided by the first clock signal terminal CK1 affects the second pull-down sub-node PD2 through the third capacitor C3 and the fourth selection transistor M19 that is turned on.

Specifically, the potential of the clock signal provided by the first clock signal terminal CK1 changes from high to low during the first reset sub-phase t321, and the potential at the second pull-down sub-node PD2 also changes from high to low. When the potential at the second pull-down sub-node PD2 is low, the fourth pull-up transistor M12, the third pull-down transistor M15, and the third output transistor M14 each are turned off.

During the first reset sub-phase t321, the second clock signal CKA received by the second clock signal terminal CK2 is high, the fourth output transistor M6 is turned on, and the output terminal OUT can normally output a reset signal to the corresponding gate line.

The potential of the clock signal provided by the first clock signal terminal CK1 changes from low to high during the second reset sub-phase t322, and thus the potential at the second pull-down sub-node PD2 also changes from low to high, the fourth pull-up transistor M12, the third pull-down transistor M15, and the third output transistor M14 each are turned on, the first level provided by the first level signal terminal VGL is written to the pull-up node PU through the fourth pull-up transistor M12 that is turned on, to reset and denoise the pull-up node PU; and the first level provided by the first level signal terminal VGL is written to the output terminal OUT through the third output transistor M14 that is turned on, to set the output terminal OUT to low to provide a reset signal to the corresponding gate line. The first level provided by the first level signal terminal VGL is written to the first pull-down sub-node PD1 through the third pull-down transistor M15 that is turned on. The third pull-up transistor M2, the second output transistor M5, and the fifth pull-down transistor M11 each are turned off.

The potential of the clock signal provided by the first clock signal terminal CK1 is low during the third reset sub-phase t323, and thus the potential at the second pull-down sub-node PD2 is also low during the third reset sub-phase t323, and the fourth pull-up transistor M12, the third pull-down transistor M15, and the third output transistor M14 each are turned off.

During the third reset sub-phase t323, the second clock signal CKA received by the second clock signal terminal CK2 is high, the fourth output transistor M6 is turned on, and the output terminal OUT can normally output a reset signal to the corresponding gate line.

Thereafter, the gate driving unit G repeatedly performs the operations during the second reset sub-phase t322 and third reset sub-phase t323 until a next frame of a scanned image arrives and starts performing the above-mentioned operations during the input phase when the next frame arrives and the gate driving unit G of a previous stage outputs a high level.

It should be noted that FIG. 4, FIG. 6, and FIG. 9 are only descriptions of the examples in which each transistor in the gate driving unit G is provided as a N-type transistor, and the type of each transistor in the gate driving unit G is not limited in the examples of the present invention. For example, at least a part of the transistors in the gate driving unit G may alternatively be provided as P-type transistors in the examples of the present invention.

Optionally, in the examples of the present invention, at least a part of the transistors in the gate driving unit G may be provided as oxide transistors, amorphous silicon transistors, low-temperature polysilicon transistors, or the like. Illustratively, the oxide transistor comprises indium gallium zinc oxide (IGZO for short).

Illustratively, an example of the present invention further provides a shift register circuit. As shown in FIG. 5, the shift register circuit 100 comprises a plurality of gate driving units in cascade, and FIG. 5 schematically shows that the shift register circuit 100 comprises m gate driving units: G1, . . . , G(n−1), Gn, G(n+1), . . . , and Gm. Wherein a first clock signal terminal CK1 of a gate driving unit of an odd-numbered stage is configured to receive a first clock signal CKB and a second clock signal terminal CK2 of the gate driving unit is configured to receive a second clock signal CKA; and a first clock signal terminal CK1 of a gate driving unit of an even-numbered stage is configured to receive a second clock signal CKA and a second clock signal terminal CK2 of the gate driving unit is configured to receive the first clock signal CKB.

As shown in FIG. 2, FIG. 3, FIG. 7, and FIG. 8, the first clock signal CKB and the second clock signal CKA signal from a fourth selection terminal, when the first clock signal CKB is at an active level, the second clock signal CKA is at an inactive level, and when the second clock signal CKA is at an active level, the first clock signal CKB is at an inactive level. When the first pull-up control signal terminal K1 is at an active level, the first clock signal CKB is at a low level.

The shift register circuit 100 provided by the example of the present invention is configured to provide a pulse signal to each gate line in the display panel row by row within a time span of one frame, and the shift register circuit 100 comprises the above-mentioned gate driving units, which can shorten the duration for which the first pull-down sub-nodes PD1 and the second pull-down sub-nodes PD2 in the gate driving units are at active levels, reduce the turn-on duration of the transistors controlled by the first pull-down sub-nodes PD1 and the second pull-down sub-nodes PD2, which prevents the problem of threshold voltage drift due to long-time turn-on of the transistors, is conducive to prolonging the service life of the transistors, and improves the reliability of the gate driving unit.

Illustratively, the gate driving unit G may be designed to have a structure as shown in FIG. 4 or may be designed to have a structure as shown in FIG. 6 or FIG. 9.

When the gate driving unit G is set to have the structure as shown in FIG. 4, illustratively, as shown in FIG. 5, the first control line L1 and the second control line L2 may be provided in the shift register circuit 100 in the example of the present invention, the first control terminals SEL11 of the gate driving units G of two adjacent stages each may be electrically connected to the first control line L1, and the second control terminals SEL12 of the gate driving units G of the two adjacent stages each may be electrically connected to the second control line L2.

Figure 10:
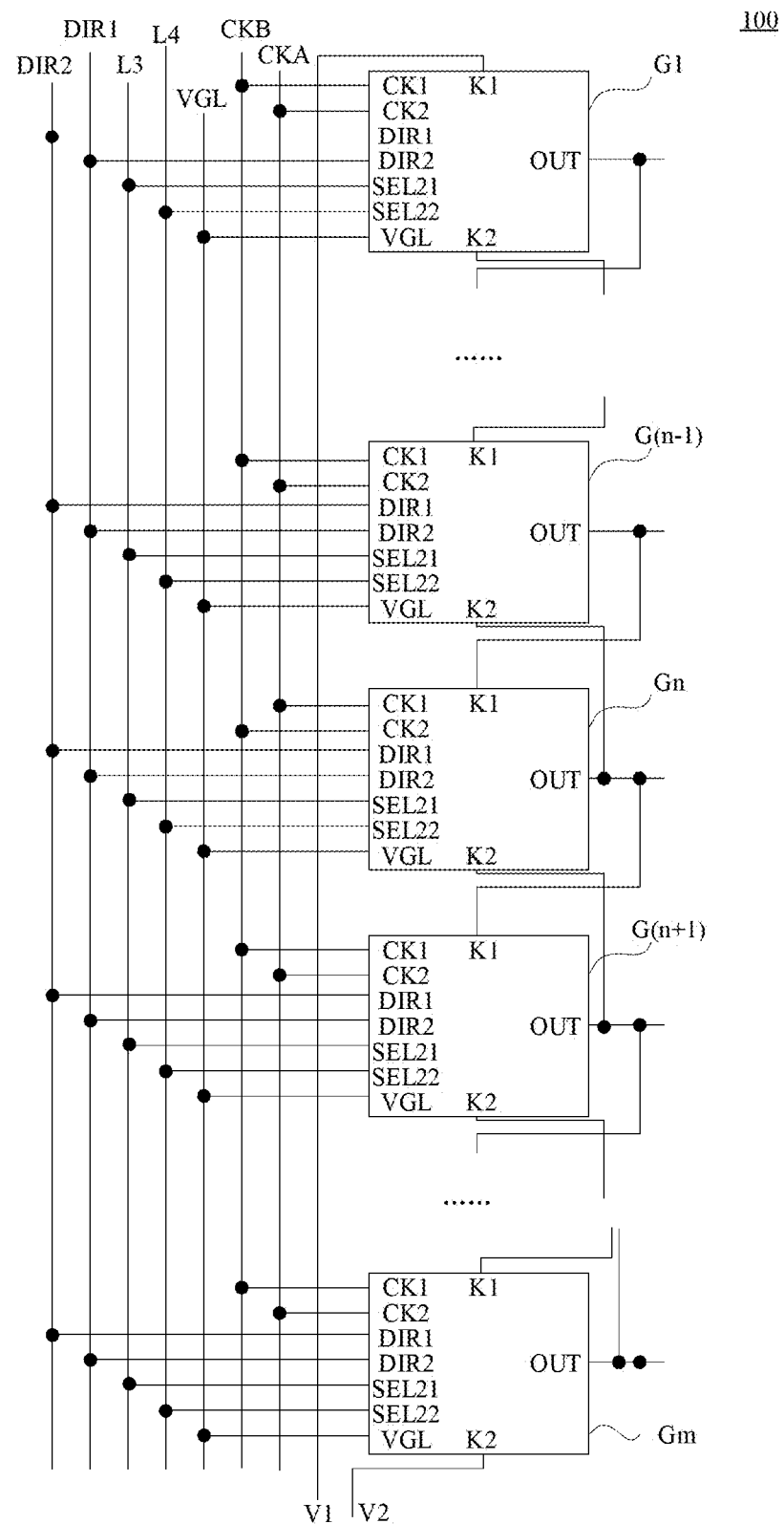
FIG. 10 is a schematic diagram of another shift register circuit provided by an example of the present invention.

When the gate driving unit G is set to have the structure as shown in FIG. 6 or FIG. 9, illustratively, as shown in FIG. 6, FIG. 9, and FIG. 10, FIG. 10 is a schematic diagram of another shift register circuit provided by an example of the present invention, wherein the second capacitor C2 and the third capacitor C3 of the gate driving unit of each stage each may be electrically connected to the first clock signal terminal CK1. That is, the second capacitor C2 and the third capacitor C3 of the gate driving unit G of an odd-numbered stage each receive the first clock signal CKB, and the second capacitor C2 and the third capacitor C3 of the gate driving unit G of an even-numbered stage each receive the second clock signal CKA. As shown in FIG. 10, the shift register circuit 100 comprises a third control line L3 and a fourth control line L4, the third control line L3 is electrically connected to the first selection terminal SEL21 of the gate driving unit of each stage, and the fourth control line L4 is electrically connected to the second selection terminal SEL22 of the gate driving unit of each stage.

Illustratively, as shown in FIG. 4, FIG. 6, and FIG. 9, the pull-up node control module 11 comprises: the first pull-up transistor M0, which is electrically connected to the first input signal DIR1 and the pull-up node PU in response to the signal from the first pull-up control signal terminal K1; and the second pull-up transistor M1, which is electrically connected to the second input signal DIR2 and the pull-up node PU in response to the signal from the second pull-up control signal terminal K2; wherein as shown in FIG. 5 and FIG. 10, the first pull-up control signal terminal K1 of the gate driving unit of each stage except the gate driving unit G1 of a first stage is electrically connected to the output terminal OUT of the gate driving unit of a previous stage; and the second pull-up control signal terminal K2 of the gate driving unit of each stage except the gate driving unit Gm of a last stage is electrically connected to the output terminal OUT of the gate driving unit of a next stage.

Illustratively, as shown in FIG. 5 and FIG. 10, the shift register circuit further comprises a first start signal line V1 and a second start signal line V2, the first start signal line V1 is connected to the first pull-up control signal terminal K1 of the gate driving unit G1 of a first stage, and the second start signal line V2 is connected to the second pull-up control signal terminal K2 of the gate driving unit Gm of a last stage. During an input phase of the gate driving unit G1 of the first stage, a first start signal provided by the first start signal line V1 is at a high level, and during a first reset sub-phase of the gate driving unit Gm at the last stage, the second start signal provided by the second start signal line V2 is at a high level.

Illustratively, an example of the present invention further provides a driving method applied to the above-mentioned gate driving unit, and the driving method comprises:

During the reset phase t31 in the first sub-period T1, as shown in FIG. 2 and FIG. 7, the second pull-down sub-node PD2 is controlled to be at an inactive level, and during at least a part of the reset phase t31 in the first sub-period T1, the first pull-down sub-node PD1 is controlled to be at an active level; as shown in FIG. 2, during the first reset sub-phase t311, the second reset sub-phase t312, and the third reset sub-phase t313 in the first sub-period T1, the first pull-down sub-node PD1 is controlled to be at the active level; and as shown in FIG. 7, during the second reset sub-phase t312 in the first sub-period T1, the first pull-down sub-node PD1 is controlled to be at the active level.

During the reset phase t32 in the second sub-period T2, as shown in FIG. 3 and FIG. 8, the first pull-down sub-node PD1 is controlled to be at an inactive level; and during at least a part of the reset phase t32 in the second sub-period T2, the second pull-down sub-node PD2 is controlled to be at an active level. As shown in FIG. 3, during the first reset sub-phase t321, the second reset sub-phase t322, and the third reset sub-phase t323 in the second sub-period T2, the second pull-down sub-node PD2 is controlled to be at the active level; and as shown in FIG. 8, during the second reset sub-phase t322 in the second sub-period T2, the second pull-down sub-node PD2 is controlled to be at the active level.

With the driving method provided by the example of the present invention, it is possible to cause the first pull-down sub-node PD1 and the second pull-down sub-node PD2 to provide the active level in a time-division manner during the reset phases in the first sub-period T1 and the second sub-period T2 such that the transistors controlled by the first pull-down sub-node PD1 and the second pull-down sub-node PD2 alternately operate in the first sub-period T1 and the second sub-period T2. Compared with the manner of providing only one pull-down node and causing the pull-down node to provide an active level during the reset phases in the first sub-period T1 and the second sub-period T2, in the provision manner provided by the example of the present invention, it is possible to shorten the duration for which the first pull-down sub-node PD1 and the second pull-down sub-node PD2 are at the active level, and thus it is possible to reduce the turn-on duration of the transistors controlled by the first pull-down sub-node PD1 and the second pull-down sub-node PD2, prevent the problem of threshold voltage drift of the transistors due to long-time turn-on, which is conducive to prolonging the service life of the transistors, and improving the reliability of the gate driving unit G.

Illustratively, as shown in FIG. 4, the first pull-down node control module 121 comprises the second capacitor C2, the first plate of the second capacitor C2 is electrically connected to the first control terminal SEL11, and the second plate of the second capacitor C2 is electrically connected to the first pull-down sub-node PD1; and the second pull-down node control module 122 comprises the third capacitor C3, the first plate of the third capacitor C3 is electrically connected to the second control terminal SEL12, and the second plate of the third capacitor C3 is electrically connected to the second pull-down sub-node PD2.

As shown in FIG. 2, the controlling the first pull-down sub-node PD1 to be at an active level during at least a part of the reset phase t31 in the first sub-period T1 as above-mentioned comprises: controlling the first control terminal SEL11 to provide the first AC signal at least in the first sub-period T1, wherein the first AC signal is at least configured to switch from low to high during at least a part of the reset phase t31 in the first sub-period T1, for example, during the second reset sub-phase t312, and the first AC signal can affect the potential at the first pull-down sub-node PD1 under the coupling effect of the second capacitor C2, such that the potential at the first pull-down sub-node PD1 also changes from low to high during at least a part of the reset phase t31 in the first sub-period T1, for example, during the second reset sub-phase t312.

As shown in FIG. 3, the controlling the second pull-down sub-node PD2 to be at an active level during at least a part of the reset phase t32 in the second sub-period T2 as above-mentioned comprises: controlling the second control terminal SEL12 to provide the second AC signal at least in the second sub-period T2. Wherein the second AC signal is at least configured to switch from low to high during at least a part of the reset phase t32 in the second sub-period T2, for example, during the second reset sub-phase t322, and the second AC signal can affect the potential at the second pull-down sub-node PD2 under the coupling effect of the third capacitor C3, such that the potential at the second pull-down sub-node PD2 also changes from low to high during at least a part of the reset phase t32 in the second sub-period T2, for example, during the second reset sub-phase t322.

In the provision manner provided by the example of the present invention, only the second capacitor C2 electrically connected to the first control terminal SEL11 needs to be provided to control the potentials at the first pull-down sub-node PD1 in the first sub-period T1 and the second sub-period T2, respectively, without the need to provide a transistor to control the potential at the first pull-down sub-node PD1. If the potential at the first pull-down sub-node PD1 is controlled by a transistor, to cause the potential at the first pull-down sub-node PD1 to meet requirements in the first sub-period T1 and the second sub-period T2, respectively, the transistor controlling the potential at the first pull-down sub-node PD1 needs to be caused continuously turned on for a long time in the first sub-period T1 or the second sub-period T2, which will result in the problem of threshold voltage drift due to long-time turn-on of the transistor controlling the potential at the first pull-down sub-node PD1 and impact on the reliability of the gate driving unit G. In the provision manner provided by the example of the present invention, only the second capacitor C2 electrically connected to the first control terminal SEL11 needs to be provided to control the potential at the first pull-down sub-node PD1 in the first sub-period T1 by using the first AC signal, without the need to provide a transistor to adjust the potential at the first pull-down sub-node PD1, which is conducive to improving the reliability of the gate driving unit G.

Similarly, in the above-mentioned provision manner provided by the example of the present invention, only the third capacitor C3 electrically connected to the second control terminal SEL12 needs to be provided to control the potentials at the second pull-down sub-node PD2 in the first sub-period T1 and the second sub-period T2, respectively, without the need to provide a transistor to control the potential at the second pull-down sub-node PD2. If the potential at the second pull-down sub-node PD2 is controlled by a transistor, to cause the potential at the second pull-down sub-node PD2 to meet requirements in the first sub-period T1 and the second sub-period T2, respectively, the transistor controlling the potential at the second pull-down sub-node PD2 needs to be caused continuously turned on for a long time in the first sub-period T1 or the second sub-period T2, which will result in the problem of threshold voltage drift due to long-time turn-on of the transistor controlling the potential at the second pull-down sub-node PD2 and impact on the reliability of the gate driving unit G. In the provision manner provided by the example of the present invention, only the third capacitor C3 electrically connected to the second control terminal SEL12 needs to be provided to control the potential at the second pull-down sub-node PD2 in the first sub-period T1 by using the second AC signal, without the need to provide a transistor to adjust the potential at the second pull-down sub-node PD2, which is conducive to improving the reliability of the gate driving unit G.

Illustratively, as shown in FIG. 2 and FIG. 3, in the example of the present invention, it is possible to cause the period of the first AC signal provided by the first control terminal SEL11 to be less than the period of the clock signal provided by the first clock signal terminal CK1, and the period of the second AC signal provided by the second control terminal SEL12 to be less than the period of the clock signal provided by the first clock signal terminal CK1.

In the first sub-period T1, when the clock signal provided by the first clock signal terminal CK1 is at a high level, the first AC signal provided by the first control terminal SEL11 is at a high level; and when the clock signal provided by the second clock signal terminal CK2 is at a high level, the first AC signal provided by the first control terminal SEL11 is also at a high level; and in the second sub-period T2, when the clock signal provided by the first clock signal terminal CK1 is at a high level, the second AC signal provided by the second control terminal SEL12 is at a high level; and when the clock signal provided by the second clock signal terminal CK2 is at a high level, the second AC signal provided by the second control terminal SEL12 is also at a high level. With such a setting, as shown in FIG. 5, the first control line L1 and the second control line L2 may be provided in the shift register circuit, the first control terminals SEL11 of the gate driving units of two adjacent stages each may be electrically connected to the first control line L1, and the second control terminals SEL12 of the gate driving units at the two adjacent stages may be electrically connected to the second control line L2, which is conducive to reducing the number of the wirings in the shift register circuit 100.

As shown in FIG. 2 and FIG. 3, the duty cycles of the high levels of the first clock signal CKB and the second clock signal CKA are less than 50%. In the first sub-period T1, during at least a part of a phase during which the two are at low levels, the first AC signal provided by the first control terminal SEL11 is also at a low level; and in the second sub-period T2, during at least a part of a phase during which the two are at low levels, the second AC signal provided by the second control terminal SEL12 is also at a low level.

With such a setting, it is possible to cause the first AC signal and the second AC signal each to have a varying potential during at least a part of the phase. The varying potential of the first AC signal may change the potential at the first pull-down sub-node PD1 under the coupling effect of the second capacitor C2, and the varying potential of the second AC signal may change the potential at the second pull-down sub-node PD2 under the coupling effect of the third capacitor C3.

As shown in FIG. 3, the controlling the first pull-down sub-node PD1 to be at an inactive level in the second sub-period T2 as above-mentioned comprises: controlling the first control terminal SEL11 to provide the first DC signal in the second sub-period T2.

Illustratively, as shown in FIG. 3 and FIG. 4, during the first reset sub-phase t321 in the second sub-period T2, in the example of the present invention, the low level at the first pull-down sub-node PD1 during the output phase t22 may be maintained through the second capacitor C2 such that the transistors controlled by the first pull-down sub-node PD1 are turned off, which prevents threshold voltage drift due to long-time turn-on of the transistors controlled by the first pull-down sub-node PD1. During the second reset sub-phase t322, in the example of the present invention, the second pull-down sub-node PD2 may control the third pull-down transistor M15 to be turned on, to provide an inactive level to the first pull-down sub-node PD1 such that the transistors controlled by the first pull-down sub-node PD1 are turned off, which prevents threshold voltage drift due to long-time turn-on of the transistors controlled by the first pull-down sub-node PD1. During the third reset sub-phase t323, in the example of the present invention, the low level at the first pull-down sub-node PD1 during the second reset sub-phase t322 may be maintained through the second capacitor C2 such that the transistors controlled by the first pull-down sub-node PD1 are turned off, which prevents threshold voltage drift due to long-time turn-on of the transistors controlled by the first pull-down sub-node PD1.

As shown in FIG. 2, the controlling the second pull-down sub-node PD2 to be at an inactive level in the first sub-period T1 as above-mentioned comprises: controlling the second control terminal SEL12 to provide the second DC signal in the first sub-period T1.

As shown in FIG. 2 and FIG. 3, during the first reset sub-phase t311 in the first sub-period T1, in the example of the present invention, the low level at the second pull-down sub-node PD2 during the output phase t21 may be maintained through the third capacitor C3 such that the transistors controlled by the second pull-down sub-node PD2 are turned off, which prevents threshold voltage drift due to long-time turn-on of the transistors controlled by the second pull-down sub-node PD2.

During the second reset sub-phase t312, in the example of the present invention, the first pull-down sub-node PD1 may control the fifth pull-down transistor M11 to be turned on, to provide an inactive level to the second pull-down sub-node PD2 such that the transistors controlled by the second pull-down sub-node PD2 are turned off, which prevents threshold voltage drift due to long-time turn-on of the transistors controlled by the second pull-down sub-node PD2.

During the third reset sub-phase t313, in the example of the present invention, the low level at the second pull-down sub-node PD2 during the second reset sub-phase t312 may be maintained through the third capacitor C3 such that the transistors controlled by the second pull-down sub-node PD2 are turned off, which prevents threshold voltage drift due to long-time turn-on of the transistors controlled by the second pull-down sub-node PD2.

Optionally, as shown in FIG. 6, in the example of the present invention, the first clock signal terminal CK1 may be reused as the above-mentioned first control terminal SEL11 and second control terminal SEL12; the first pull-down node control module 121 further comprises the first selection unit 21, which is configured to be electrically connected to the first level signal terminal VGL and the first pull-down sub-node PD1 under the control of the first selection terminal SEL21; and the second pull-down node control module 122 further comprises the second selection unit 22, which is configured to be electrically connected to the first level signal terminal VGL and the second pull-down sub-node PD2 under the control of the second selection terminal SEL22.

As shown in FIG. 6 and FIG. 7, the controlling the first pull-down sub-node PD1 to be at an active level during at least a part of the reset phase in the first sub-period T1 as above-mentioned comprises: controlling the first selection terminal SEL21 to provide an inactive level in the first sub-period T1. The first selection unit 21 is turned off under the action of the inactive level, the first level signal terminal VGL is disconnected from the first pull-down sub-node PD1, and the clock signal provided by the first clock signal terminal CK1 affects the potential at the first pull-down sub-node PD1 under the coupling effect of the second capacitor C2.

As shown in FIG. 6 and FIG. 7, the controlling the second pull-down sub-node PD2 to be at an inactive level in the first sub-period T1 as above-mentioned comprises: controlling the second selection terminal SEL22 to provide an active level in the first sub-period T1. The second selection unit 22 is turned on under the action of the active level, the first level signal provided by the first level signal terminal VGL is written to the second pull-down sub-node PD2 through the second selection unit that is turned on, to cause the second pull-down sub-node PD2 to be at an inactive level.

As shown in FIG. 6 and FIG. 8, the controlling the first pull-down sub-node PD1 to be at an inactive level in the second sub-period T2 as above-mentioned comprises: controlling the first selection terminal SEL21 to provide an active level in the second sub-period T2. The first selection unit 21 is turned on under the action of the active level, the first level signal provided by the first level signal terminal VGL is written to the first pull-down sub-node PD1 through the first selection unit 21 that is turned on, to cause the first pull-down sub-node PD1 to be at an inactive level.

As shown in FIG. 6 and FIG. 8, the controlling the second pull-down sub-node PD2 to be at an active level during at least a part of the reset phase in the second sub-period T2 as above-mentioned comprises: controlling the second selection terminal SEL22 to provide an inactive level in the second sub-period T2. The second selection unit 22 is turned off under the action of the inactive level, the first level signal terminal VGL is disconnected from the second pull-down sub-node PD2, and the clock signal provided by the first clock signal terminal CK1 affects the potential at the second pull-down sub-node PD2 under the coupling effect of the third capacitor C3.

Illustratively, as shown in FIG. 8 and FIG. 9, in the example of the present invention, the second capacitor C2 may further be reused as the third capacitor C3, and the first pull-down node control module 121 further comprises the third selection unit 23, which is electrically connected to the second plate of the second capacitor C2 and the first pull-down sub-node PD1 in response to the signal from the third selection terminal SEL23; and the second pull-down node control module 122 further comprises the fourth selection unit 23, which is electrically connected to the second plate of the second capacitor C2 and the second pull-down sub-node PD2 in response to the signal from the fourth selection terminal SEL24.

The controlling the first pull-down sub-node PD1 to be at an active level during at least a part of the reset phase t31 in the first sub-period T1 as above-mentioned comprises: controlling the third selection terminal SEL23 to provide an active level in the first sub-period T1. The third selection unit 23 is turned on under the action of the active level, and the clock signal provided by the first clock signal terminal CK1 affects the potential at the first pull-down sub-node PD1 under the coupling effect of the second capacitor C2.

The controlling the first pull-down sub-node PD1 to be at an inactive level in the second sub-period T2 as above-mentioned comprises: controlling the third selection terminal SEL23 to provide an inactive level in the second sub-period T2. The third selection unit 23 is turned off under the action of the inactive level, the first clock signal terminal CK1 may not affect the potential at the first pull-down sub-node PD1 under the coupling effect of the second capacitor C2. When the foregoing first selection unit 21 is turned on, the first level signal provided by the first level signal terminal VGL may be written to the first pull-down sub-node PD1 through the first selection unit 21 that is turned on, to cause the first pull-down sub-node PD1 to be at an inactive level.

The controlling the second pull-down sub-node PD2 to be at an active level during at least a part of the reset phase t32 in the second sub-period T2 as above-mentioned comprises: controlling the fourth selection terminal SEL24 to provide an active level in the second sub-period T2. The fourth selection unit 24 is turned on under the action of the active level, and the clock signal provided by the first clock signal terminal CK1 affects the potential at the second pull-down sub-node PD2 under the coupling effect of the second capacitor C2.

The controlling the second pull-down sub-node PD2 to be at an inactive level in the first sub-period T1 as above-mentioned comprises: controlling the fourth selection terminal SEL24 to provide an inactive level in the first sub-period T1. The fourth selection unit 24 is turned off under the action of the inactive level, and the first clock signal terminal CK1 cannot affect the potential at the second pull-down sub-node PD2 under the coupling effect of the second capacitor C2. When the foregoing second selection unit 22 is turned on, the first level signal provided by the first level signal terminal VGL may be written to the second pull-down sub-node PD2 through the second selection unit 22 that is turned on, to cause the second pull-down sub-node PD2 to be at an inactive level.

Illustratively, as shown in FIG. 9, in the example of the present invention, the above-mentioned second selection terminal SEL22 may be reused as the third selection terminal SEL23, and the above-mentioned first selection terminal SEL21 may be reused as the fourth selection terminal SEL24, to reduce a quantity of signals needed for the gate driving unit to operate and simplify the circuit structure of the gate driving unit.

Figure 11:
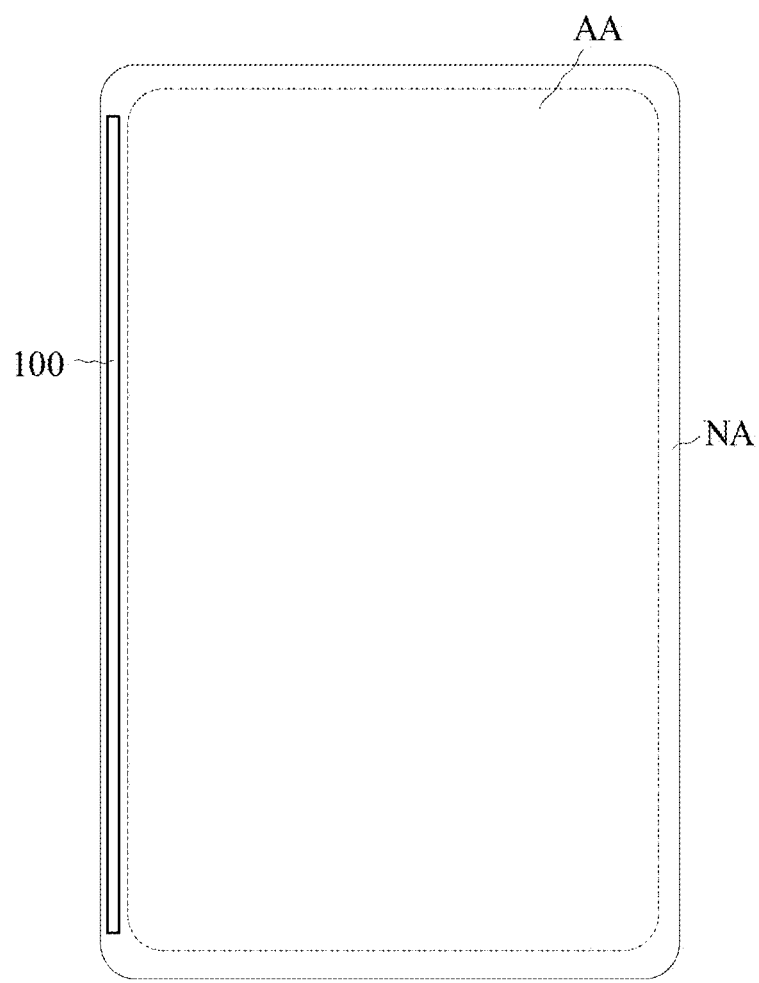
FIG. 11 is a schematic diagram of a display apparatus provided by an example of the present invention.

An example of the present invention further provides a display apparatus. As shown in FIG. 11, FIG. 11 is a schematic diagram of a display apparatus provided by an example of the present invention, and the display apparatus comprises a gate line, a data line, subpixels, and the above-mentioned shift register circuit 100. Wherein the specific structure of the shift register circuit 100 has been described in detail in the above-mentioned example and is not described herein again. Certainly, the display apparatus as shown in FIG. 11 is only for schematic illustration and may be any electronic device having a display function, such as a mobile phone, a tablet computer, a notebook computer, an ebook, a television, or an in-vehicle display.

The gate driving unit of each stage in the shift register circuit 100 is electrically connected to the gate line. When the display apparatus operates, the gate driving unit of each stage sequentially outputs an active level to scan the gate line row by row.

Illustratively, the above-mentioned shift register circuit 100 may be fabricated on a thin film transistor (TFT for short) array substrate of a display panel through an array process of the display panel by using a gate driver on array (GOA for short) technology. The GOA technology can eliminate a process of bonding an external integrated circuit (IC), which is conducive to increasing production capacity and reducing product cost.

As shown in FIG. 11, the display apparatus comprises a display region AA and a non-display region NA, and the shift register circuit 100 is located in the non-display region NA.

The above descriptions are merely preferred examples of the present application and are not intended to limit the present invention. Any modification, equivalent replacement and improvement within the spirit and principle of the present invention shall be comprised within the protection scope of the present invention.

What is claimed is:

1. A gate driving unit, wherein an operating period of the gate driving unit comprises a first sub-period and a second sub-period, and the first sub-period and the second sub-period each comprise an input phase, an output phase, and a reset phase, the gate driving unit comprising:
   a pull-up node control module electrically connected to a pull-up node, the pull-up node control module outputting an active level to the pull-up node during the input phase in response to a signal from a first pull-up control signal terminal;
   a first pull-down node control module electrically connected to a first pull-down sub-node, wherein the first pull-down node control module configured to cause the first pull-down sub-node to be at an active level during at least a part of the reset phase in the first sub-period, and to cause the first pull-down sub-node to be at an inactive level during the reset phase in the second sub-period;
   a second pull-down node control module electrically connected to a second pull-down sub-node, wherein the second pull-down node control module configured to cause the second pull-down sub-node to be at an inactive level during the reset phase in the first sub-period, and to cause the second pull-down sub-node to be at an active level during at least a part of the reset phase in the second sub-period; and
   an output module electrically connected to an output terminal and a first clock signal terminal during the output phase in response to a signal from the pull-up node, electrically connected to the output terminal and a first level signal terminal during at least a part of the reset phase in the second sub-period in response to a signal from the first pull-down sub-node, and electrically connected to the output terminal and the first level signal terminal during at least a part of the reset phase in the first sub-period in response to a signal from the second pull-down sub-node, wherein the first clock signal terminal transmits a clock signal.

2. The gate driving unit according to claim 1, further comprising:
a first capacitor, wherein a first plate of the first capacitor is electrically connected to the output terminal; and
a second plate of the first capacitor, wherein the second plate is electrically connected to the pull-up node.

3. The gate driving unit according to claim 1, wherein,
the first pull-down node control module comprises a second capacitor, wherein a first plate of the second capacitor is electrically connected to a first control terminal and a second plate of the second capacitor is electrically connected to the first pull-down sub-node, and the first control terminal is configured to provide a first alternating current (AC) signal at least in the first sub-period; and
the second pull-down node control module comprises a third capacitor, a first plate of the third capacitor is electrically connected to a second control terminal and a second plate of the third capacitor is electrically connected to the second pull-down sub-node, and the second control terminal is configured to provide a second AC signal at least in the second sub-period.

4. The gate driving unit according to claim 3, wherein a period of the first AC signal is less than a period of the clock signal transmitted by the first clock signal terminal, and the first AC signal is at a high level when the clock signal transmitted by the first clock signal terminal is at a high level, and the first control terminal is further configured to provide a first direct current (DC) signal in the second sub-period; and the second control terminal is further configured to provide a second DC signal in the first sub-period.

5. The gate driving unit according to claim 3, wherein the first clock signal terminal is reused as the first control terminal and the second control terminal, the first pull-down node control module further comprises a first selection unit configured to be electrically connected to the first level signal terminal and the first pull-down sub-node under the control of a first selection terminal;
and the first selection terminal is configured to provide an inactive level in the first sub-period and provide an active level in the second sub-period, and the second pull-down node control module further comprises a second selection unit configured to be electrically connected to the first level signal terminal and the second pull-down sub-node under the control of a second selection terminal;
and the second selection terminal is configured to provide an active level in the first sub-period and provide an inactive level in the second sub-period.

6. The gate driving unit according to claim 5, wherein the second capacitor is reused as the third capacitor, the first pull-down node control module further comprises a third selection unit electrically connected to the second plate of the second capacitor and the first pull-down sub-node in response to a signal from a third selection terminal, the second pull-down node control module further comprises a fourth selection unit electrically connected to the second plate of the second capacitor and the second pull-down sub-node in response to a signal from a fourth selection terminal, the third selection terminal is configured to provide an active level in the first sub-period and provide an inactive level in the second sub-period, and the fourth selection terminal is configured to provide an inactive level in the first sub-period and provide an active level in the second sub-period.

7. The gate driving unit according to claim 1, wherein the pull-up node control module comprises:
a first pull-up transistor electrically connected to a first input signal and the pull-up node in response to the signal from the first pull-up control signal terminal; and
a second pull-up transistor electrically connected to a second input signal and the pull-up node in response to a signal from a second pull-up control signal terminal.

8. The gate driving unit according to claim 7, wherein the pull-up node control module further comprises:
a third pull-up transistor electrically connected to the first level signal terminal and the pull-up node in response to the signal from the first pull-down sub-node; and
a fourth pull-up transistor electrically connected to the first level signal terminal and the pull-up node in response to the signal from the second pull-down sub-node.

9. The gate driving unit according to claim 7, wherein the first pull-down node control module further comprises:
a first pull-down transistor electrically connected to the first level signal terminal and the first pull-down sub-node in response to the signal from the pull-up node;
a second pull-down transistor electrically connected to the first level signal terminal and the first pull-down sub-node in response to the signal from the first pull-up control signal terminal; and
a third pull-down transistor electrically connected to the first level signal terminal and the first pull-down sub-node in response to the signal from the second pull-down sub-node;
and wherein
the second pull-down node control module further comprises:
a fourth pull-down transistor electrically connected to the first level signal terminal and the second pull-down sub-node in response to the signal from the first pull-up control signal terminal;
a fifth pull-down transistor electrically connected to the first level signal terminal and the second pull-down sub-node in response to the signal from the first pull-down sub-node; and
a sixth pull-down transistor electrically connected to the first level signal terminal and the second pull-down sub-node in response to the signal from the pull-up node.

10. The gate driving unit according to claim 1, wherein the output module comprises:
a first output transistor electrically connected to the output terminal and the first clock signal terminal in response to the signal from the pull-up node;
a second output transistor electrically connected to the output terminal and the first level signal terminal in response to the signal from the first pull-down sub-node;
a third output transistor electrically connected to the output terminal and the first level signal terminal in response to the signal from the second pull-down sub-node; and
a fourth output transistor electrically connected to the output terminal and the first level signal terminal in response to a signal from a second clock signal terminal.

11. The gate driving unit according to claim 1, wherein the gate driving unit further comprises a reset module including:
a first reset transistor electrically connected to the first level signal terminal and the pull-up node in response to a reset signal; and a second reset transistor electrically connected to the first level signal terminal and the output terminal in response to the reset signal.

12. A shift register circuit, wherein the shift register circuit comprises:
a plurality of gate driving units in cascade, wherein an operating period of the gate driving unit comprises a first sub-period and a second sub-period, and the first sub-period and the second sub-period each comprise an input phase, an output phase, and a reset phase;
each gate driving unit of the plurality of gate driving units comprises:
a pull-up node control module electrically connected to a pull-up node, the pull-up node control module outputting an active level to the pull-up node during the input phase in response to a signal from a first pull-up control signal terminal;
a first pull-down node control module electrically connected to a first pull-down sub-node, the first pull-down node control module configured to cause the first pull-down sub-node to be at an active level during at least a part of the reset phase in the first sub-period, and to cause the first pull-down sub-node to be at an inactive level during the reset phase in the second sub-period;
a second pull-down node control module electrically connected to a second pull-down sub-node, the second pull-down node control module configured to cause the second pull-down sub-node to be at an inactive level during the reset phase in the first sub-period, and to cause the second pull-down sub-node to be at an active level during at least a part of the reset phase in the second sub-period; and
an output module electrically connected to an output terminal and a first clock signal terminal during the output phase in response to a signal from the pull-up node, electrically connected to the output terminal and a first level signal terminal during at least a part of the reset phase in the second sub-period in response to a signal from the first pull-down sub-node, and electrically connected to the output terminal and the first level signal terminal during at least a part of the reset phase in the first sub-period in response to a signal from the second pull-down sub-node, wherein the first clock signal terminal transmits a clock signal,
the first clock signal terminal of the gate driving unit of an odd-numbered stage is configured to receive a first clock signal, and the first clock signal terminal of the gate driving unit of an even-numbered stage is configured to receive a second clock signal; and
the first clock signal and the second clock signal are periodic pulse signals, the second clock signal is at an inactive level when the first clock signal is at an active level, and the first clock signal is at an inactive level when the second clock signal is at an active level.

13. The shift register circuit according to claim 12, wherein the pull-up node control module comprises:
a first pull-up transistor electrically connected to a first input signal and the pull-up node in response to the signal from the first pull-up control signal terminal; and
a second pull-up transistor electrically connected to a second input signal and the pull-up node in response to a signal from a second pull-up control signal terminal, wherein, the first pull-up control signal terminal of the gate driving unit of each stage except the gate driving unit of a first stage is connected to the output terminal of the gate driving unit of a previous stage, and the second pull-up control signal terminal of the gate driving unit of each stage except the gate driving unit of a last stage is connected to the output terminal of the gate driving unit of a next stage.

14. A driving method applied to a gate driving unit wherein an operating period of the gate driving unit comprises a first sub-period and a second sub-period, and the first sub-period and the second sub-period each comprise an input phase, an output phase, and a reset phase, and wherein the gate driving unit comprises:
a pull-up node control module electrically connected to a pull-up node, the pull-up node control module outputting an active level to the pull-up node during the input phase in response to a signal from a first pull-up control signal terminal;
a first pull-down node control module electrically connected to a first pull-down sub-node, the first pull-down node control module configured to cause the first pull-down sub-node to be at an active level during at least a part of the reset phase in the first sub-period, and to cause the first pull-down sub-node to be at an inactive level during the reset phase in the second sub-period;
a second pull-down node control module electrically connected to a second pull-down sub-node, the second pull-down node control module configured to cause the second pull-down sub-node to be at an inactive level during the reset phase in the first sub-period, and to cause the second pull-down sub-node to be at an active level during at least a part of the reset phase in the second sub-period; and
an output module electrically connected to an output terminal and a first clock signal terminal during the output phase in response to a signal from the pull-up node, electrically connected to the output terminal and a first level signal terminal during at least a part of the reset phase in the second sub-period in response to a signal from the first pull-down sub-node, and electrically connected to the output terminal and the first level signal terminal during at least a part of the reset phase in the first sub-period in response to a signal from the second pull-down sub-node, wherein the first clock signal terminal transmits a clock signal;
wherein the method comprises:
controlling the first pull-down sub-node to be at an active level during at least a part of the reset phase in the first sub-period and the second pull-down sub-node to be at an inactive level during the reset phase in the first sub-period; and
controlling the second pull-down sub-node to be at an active level during at least a part of the reset phase in the second sub-period and the first pull-down sub-node to be at an inactive level during the reset phase in the second sub-period.

15. The driving method according to claim 14, wherein the first pull-down node control module comprises a second capacitor, a first plate of the second capacitor is electrically connected to a first control terminal and a second plate of the second capacitor is electrically connected to the first pull-down sub-node, the second pull-down node control module comprises a third capacitor, a first plate of the third capacitor is electrically connected to a second control terminal and a second plate of the third capacitor is electrically connected to the second pull-down sub-node, and wherein the controlling the first pull-down sub-node to be at an active level during at least a part of the reset phase in the first sub-period and the second pull-down sub-node to be at an active level during at least a part of the reset phase in the second sub-period comprises:

controlling the first control terminal to provide a first alternating current (AC) signal at least in the first sub-period and the second control terminal to provide a second AC signal at least in the second sub-period.

16. The driving method according to claim 15, wherein a period of the first AC signal is less than a period of the clock signal transmitted by the first clock signal terminal, and the first AC signal is at a high level when the clock signal transmitted by the first clock signal terminal is at a high level, a period of the second AC signal is less than the period of the clock signal transmitted by the first clock signal terminal, and the second AC signal is at a high level when the clock signal transmitted by the first clock signal terminal is at a high level, and the driving method further comprises:

controlling the first control terminal to provide a first direct current (DC) signal in the second sub-period and the second control terminal to provide a second DC signal in the first sub-period.

17. The driving method according to claim 15, wherein the first clock signal terminal is reused as the first control terminal and the second control terminal, the first pull-down node control module further comprises a first selection unit configured to be electrically connected to the first level signal terminal and the first pull-down sub-node under the control of a first selection terminal, the second pull-down node control module further comprises a second selection unit configured to be electrically connected to the first level signal terminal and the second pull-down sub-node under the control of a second selection terminal, and controlling the first pull-down sub-node to be at an active level during at least a part of the reset phase in the first sub-period and the second pull-down sub-node to be at an inactive level during the reset phase in the first sub-period and the controlling the second pull-down sub-node to be at an active level during at least a part of the reset phase in the second sub-period and the first pull-down sub-node to be at an inactive level during the reset phase in the second sub-period comprise:

controlling the first selection terminal to provide an inactive level in the first sub-period and provide an active level in the second sub-period; and controlling the second selection terminal to provide an active level in the first sub-period and provide an inactive level in the second sub-period.

18. The driving method according to claim 17, wherein the second capacitor is reused as the third capacitor, the first pull-down node control module further comprises a third selection unit electrically connected to the second plate of the second capacitor and the first pull-down sub-node in response to a signal from a third selection terminal, the second pull-down node control module further comprises a fourth selection unit electrically connected to the second plate of the second capacitor and the second pull-down sub-node in response to a signal from a fourth selection terminal, and the driving method further comprises:

controlling the third selection terminal to provide an active level in the first sub-period and provide an inactive level in the second sub-period; and controlling the fourth selection terminal to provide an inactive level in the first sub-period and provide an active level in the second sub-period.

* * * * *